(12) United States Patent
Mizusawa et al.

(10) Patent No.: US 8,987,974 B2
(45) Date of Patent: Mar. 24, 2015

(54) PIEZOELECTRIC DEVICE AND METHOD FOR MANUFACTURING THE SAME

(75) Inventors: Shuichi Mizusawa, Saitama (JP); Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 353 days.

(21) Appl. No.: 13/562,328

(22) Filed: Jul. 31, 2012

(65) Prior Publication Data
US 2013/0033153 A1    Feb. 7, 2013

(30) Foreign Application Priority Data

Aug. 5, 2011    (JP) .................... 2011-171423

(51) Int. Cl.
| H01L 41/08 | (2006.01) |
| H03H 9/17 | (2006.01) |
| H03H 9/05 | (2006.01) |
| H03H 9/10 | (2006.01) |

(52) U.S. Cl.
CPC ............. *H03H 9/171* (2013.01); *H03H 9/0595* (2013.01); *H03H 9/1035* (2013.01)
USPC .......................................... 310/344; 310/348

(58) Field of Classification Search
CPC .. H03H 9/1021; H03H 9/1035; H03H 9/0595
USPC .................................................. 310/344, 348
See application file for complete search history.

(56) References Cited

U.S. PATENT DOCUMENTS

| 6,531,806 | B1 * | 3/2003 | Daidai ........................... 310/344 |
| 7,215,065 | B2 * | 5/2007 | Masuko et al. ............... 310/344 |
| 8,773,005 | B2 * | 7/2014 | Mizusawa et al. ............ 310/344 |
| 2011/0114353 | A1 * | 5/2011 | Iizuka et al. .................. 174/50.5 |
| 2011/0187235 | A1 * | 8/2011 | Yoshimatsu .................. 310/348 |
| 2011/0215879 | A1 * | 9/2011 | Aratake ......................... 331/158 |
| 2012/0025672 | A1 * | 2/2012 | Morita .......................... 310/344 |
| 2012/0152585 | A1 * | 6/2012 | Maeda et al. ............... 174/50.51 |
| 2013/0063001 | A1 * | 3/2013 | Takahashi et al. ............. 310/344 |
| 2013/0328449 | A1 * | 12/2013 | Takahashi et al. ............. 310/344 |

FOREIGN PATENT DOCUMENTS

| JP | 06-343017 | | 12/1994 | |
| JP | 07154183 | A * | 6/1995 | ............... H03H 9/02 |
| JP | 07212159 | A * | 8/1995 | ............ H03H 3/007 |

* cited by examiner

*Primary Examiner* — J. San Martin
(74) *Attorney, Agent, or Firm* — Jianq Chyun IP Office

(57) ABSTRACT

A piezoelectric device includes a piezoelectric vibrating piece with a pair of excitation electrodes, a base plate, and a non-conductive bonding material. The base includes a pair of castellations that are hollowed into a side face from the mounting surface to the bonding surface. The pair of castellations include a first surface and a second surface. The first surface extends outward from the mounting surface toward the bonding surface side. The second surface extends outward from the bonding surface toward the mounting surface side. The second surface has a smaller area than an area of the first surface. A wiring electrode is disposed on the first surface, the second surface, and a side face of the bonding material. The wiring electrode is of a same electrode layer as the external electrode. The wiring electrode extends from the external electrode to the extraction electrodes.

8 Claims, 19 Drawing Sheets

FIG. 2A
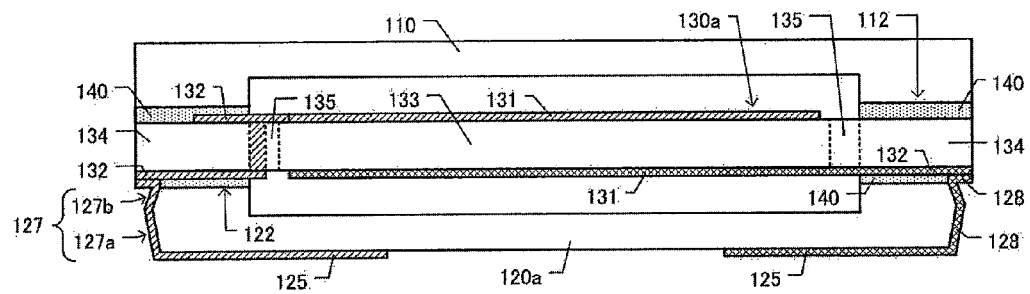
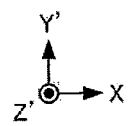
FIG. 2B
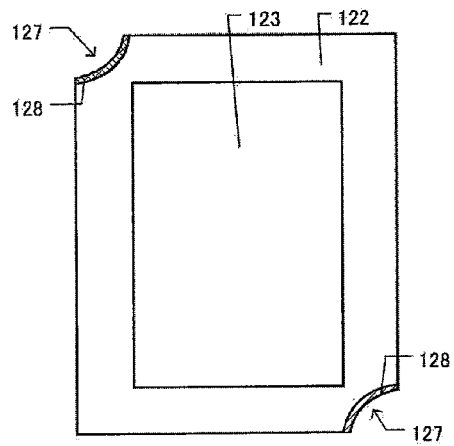
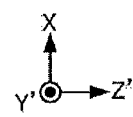
FIG. 2C
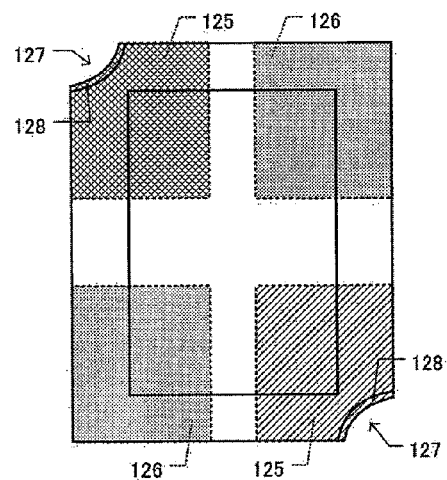
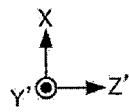

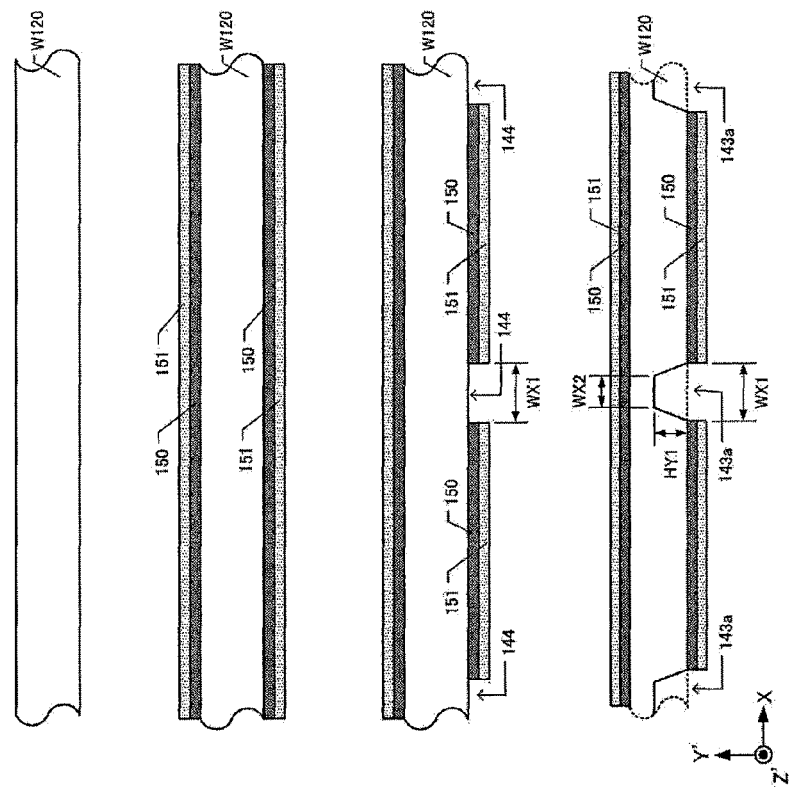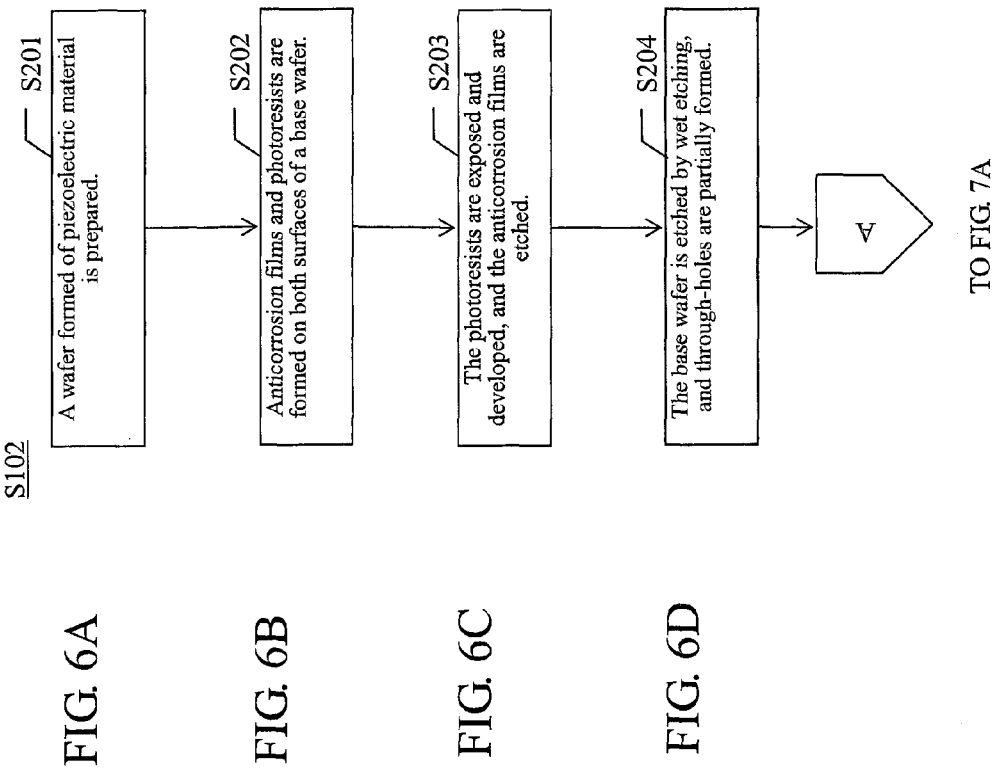

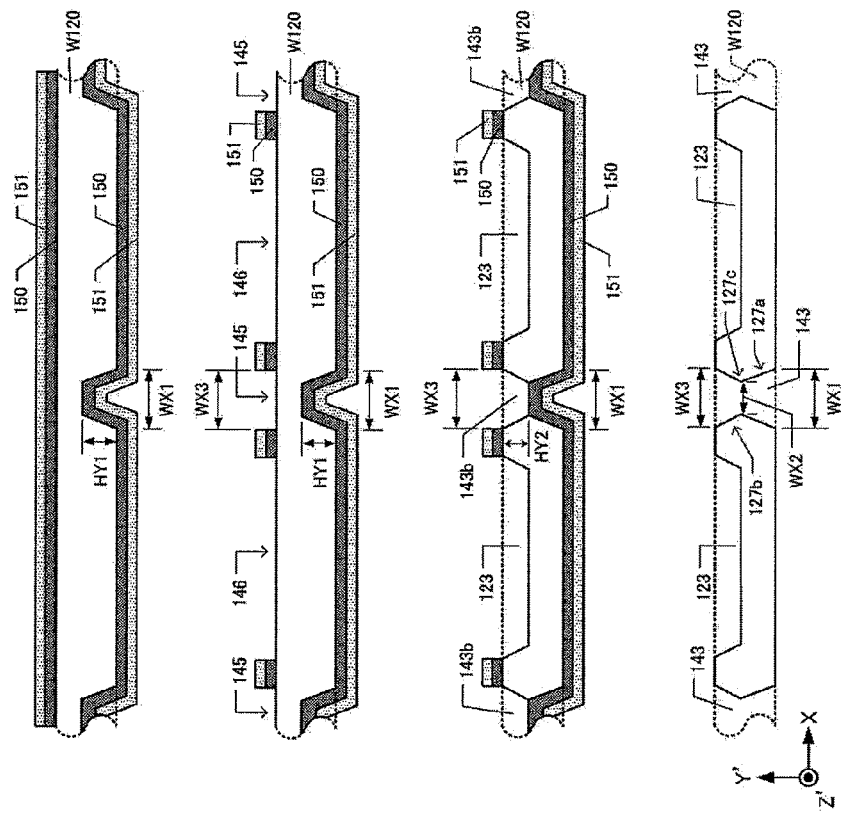
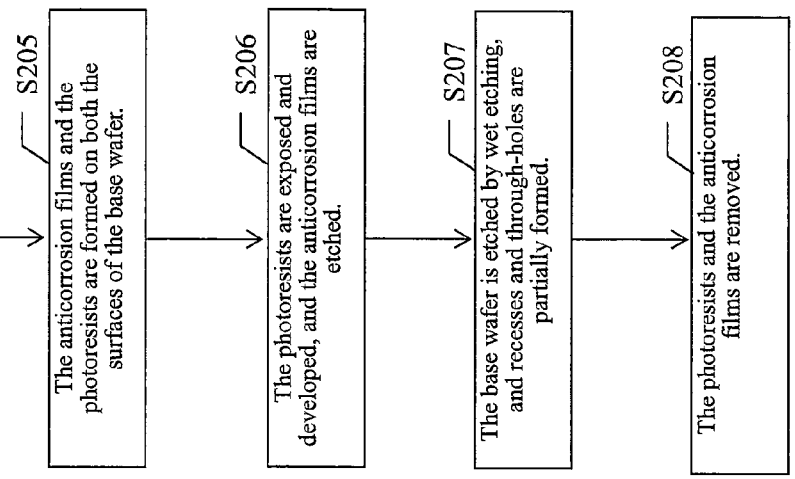
FIG. 7A
FIG. 7B
FIG. 7C
FIG. 7D

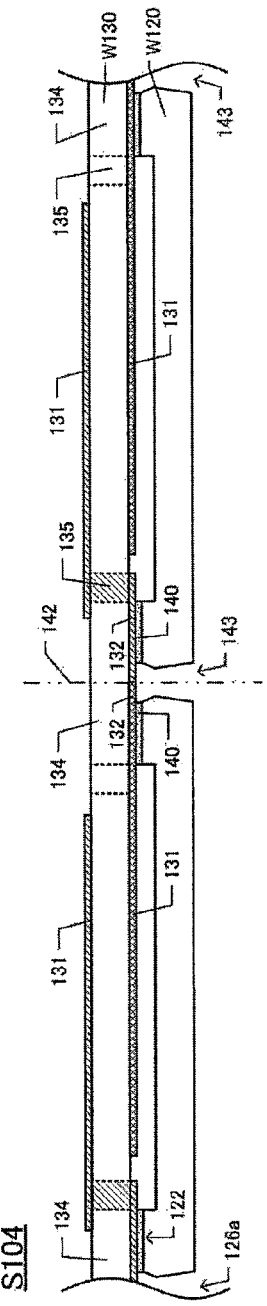
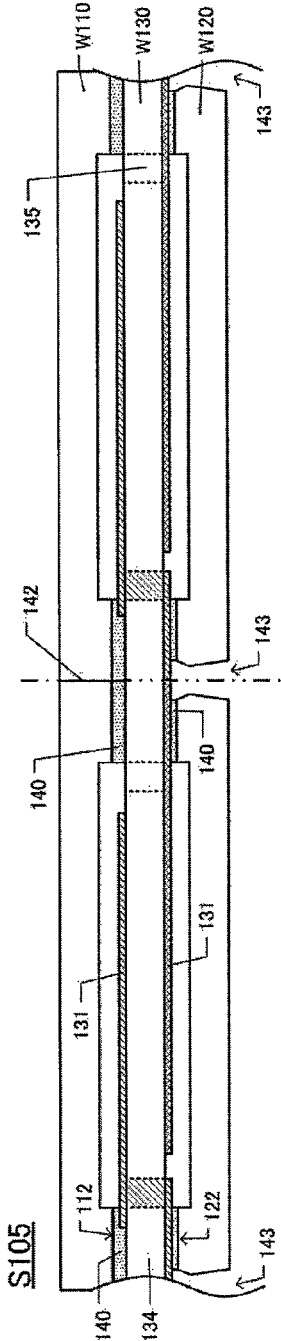
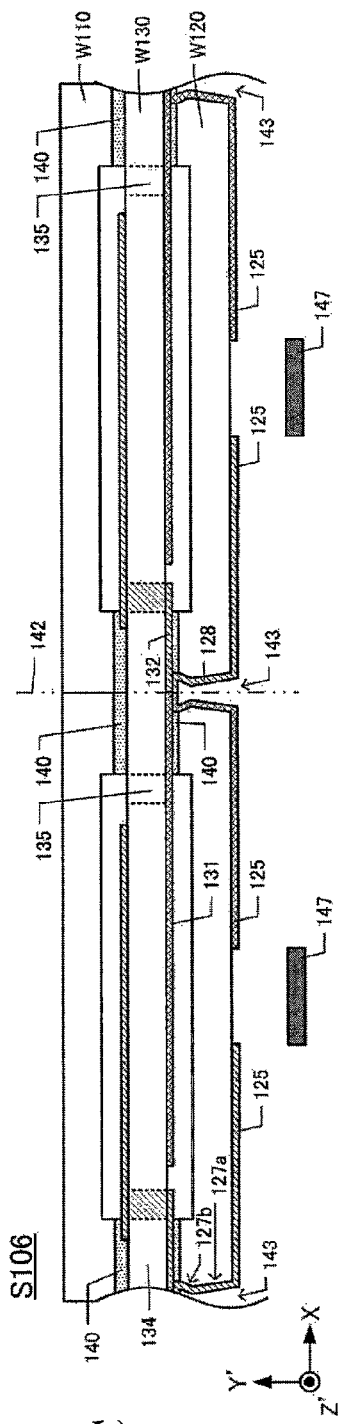
FIG. 8A
FIG. 8B
FIG. 8C

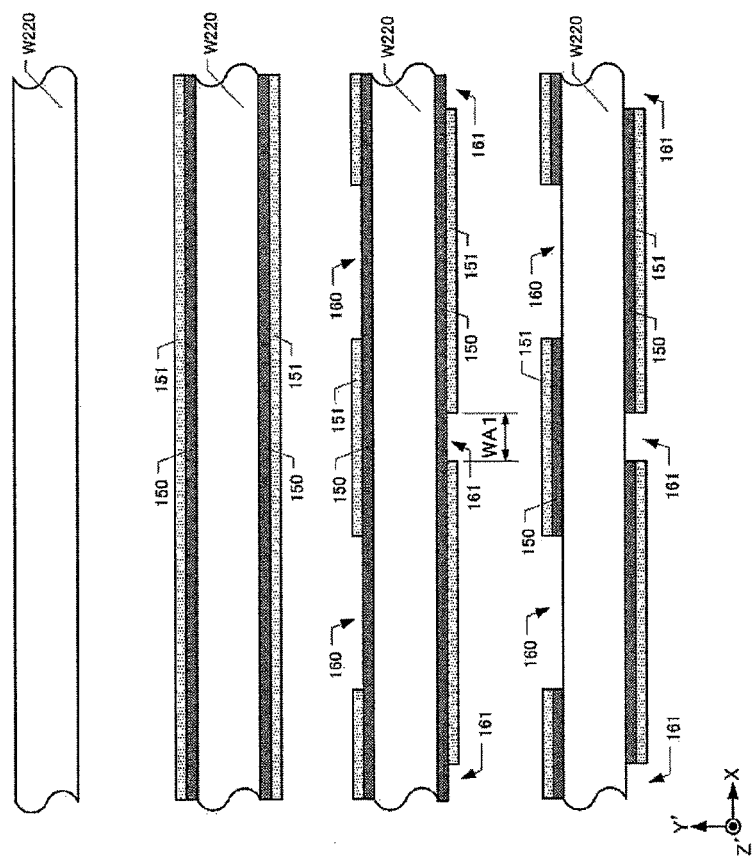
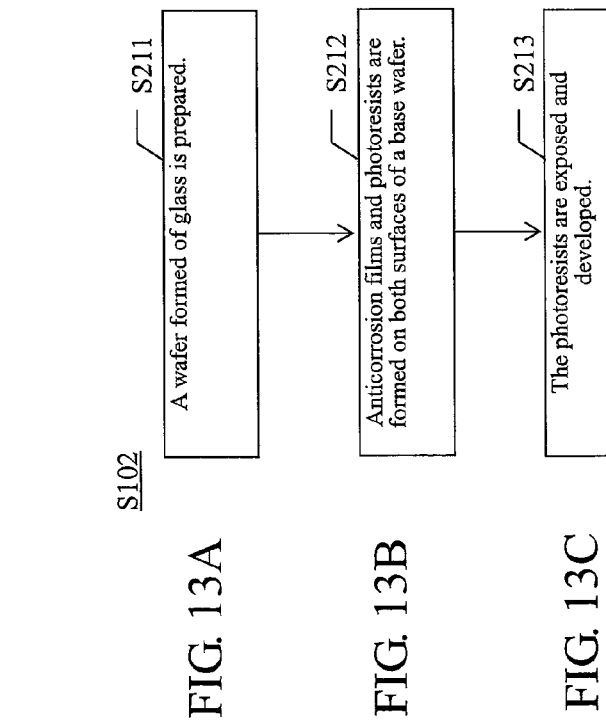
FIG. 13A  S102  S211 A wafer formed of glass is prepared.
FIG. 13B  S212 Anticorrosion films and photoresists are formed on both surfaces of a base wafer.
FIG. 13C  S213 The photoresists are exposed and developed.
FIG. 13D  S214 The anticorrosion films are etched.
TO FIG. 14A

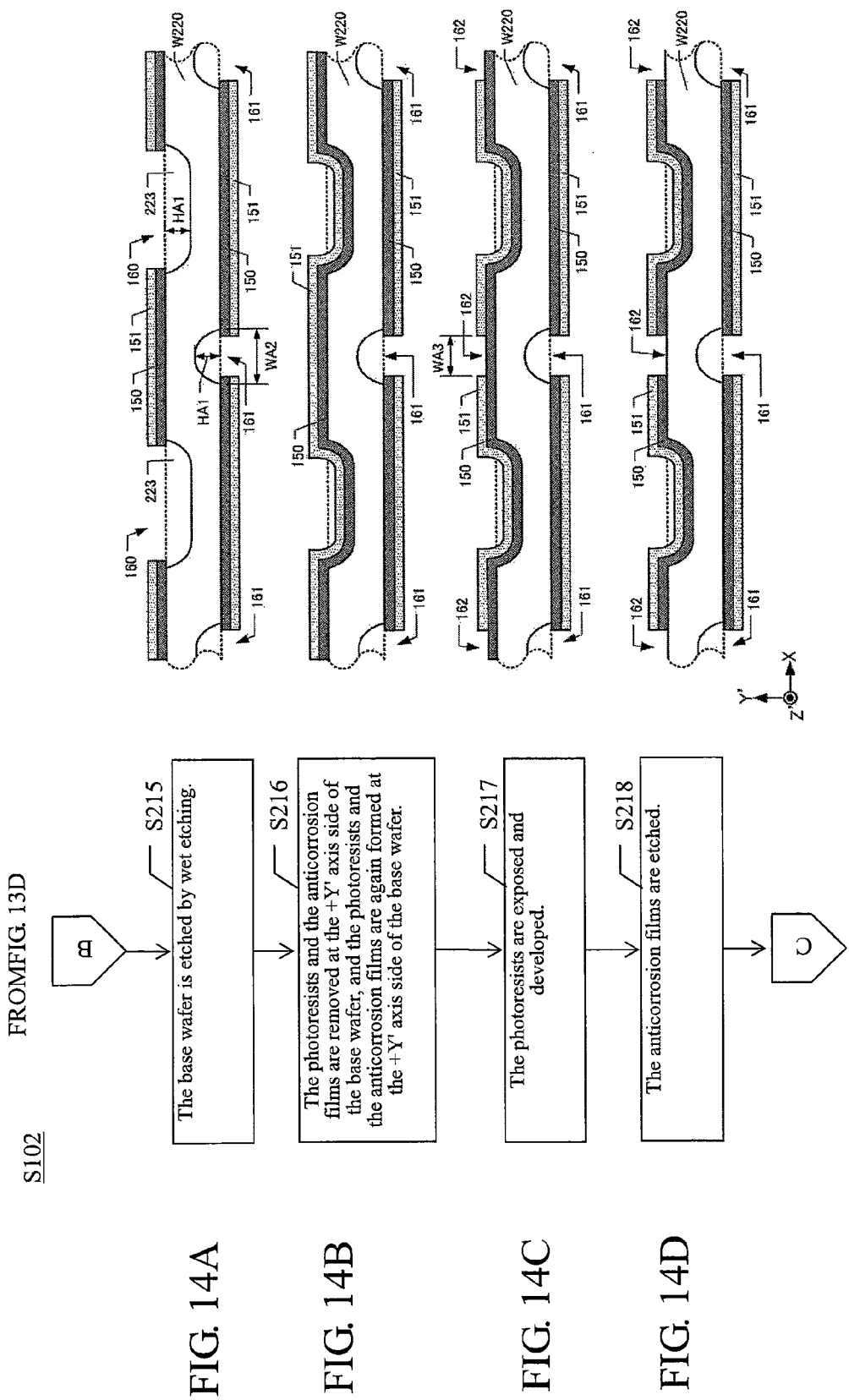

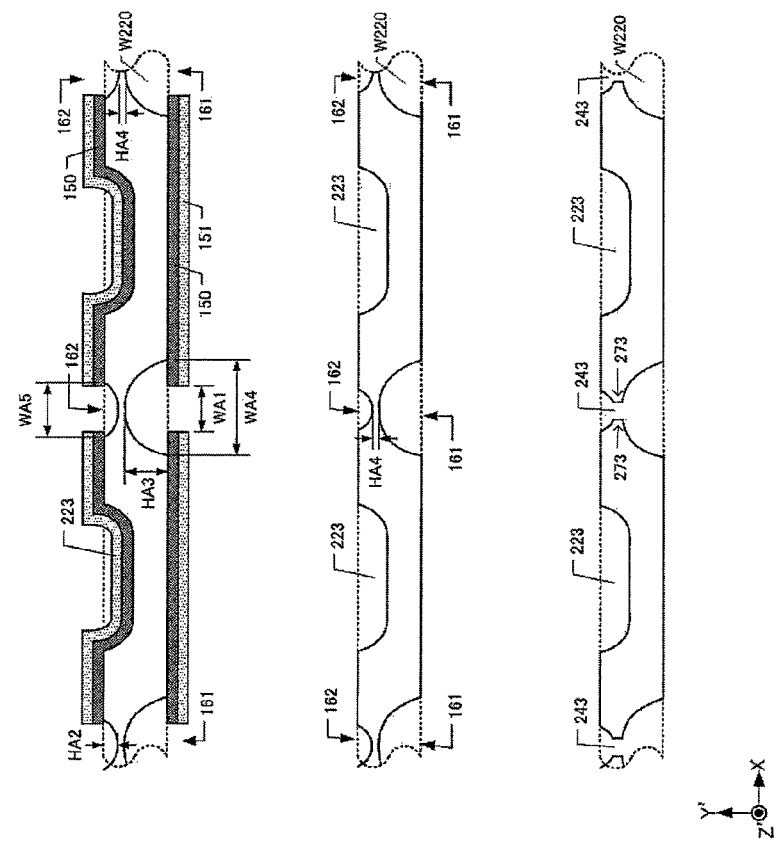
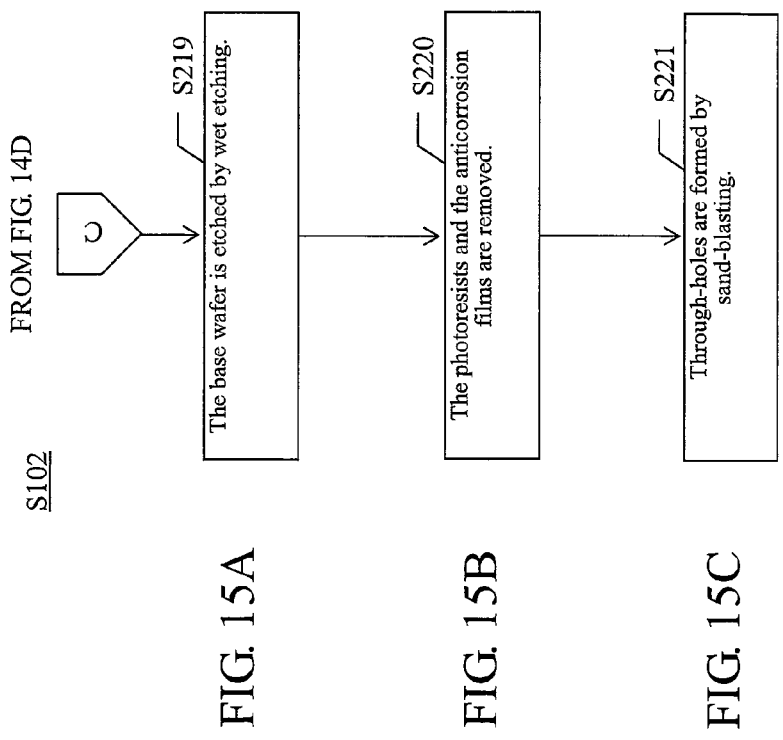
FIG. 15A
FIG. 15B
FIG. 15C

PIEZOELECTRIC DEVICE AND METHOD FOR MANUFACTURING THE SAME

CROSS REFERENCE TO RELATED APPLICATIONS

This application claims the priority benefit of Japan application serial no. 2011-171423, filed on Aug. 5, 2011. The entirety of the above-mentioned patent application is hereby incorporated by reference herein and made a part of this specification.

TECHNICAL FIELD

This disclosure relates to methods for manufacturing piezoelectric devices where wiring electrodes formed on castellations extend to extraction electrodes of piezoelectric pieces via side faces of bonding materials. The disclosure also relates to piezoelectric devices produced by the methods.

DESCRIPTION OF THE RELATED ART

A known piezoelectric device includes a piezoelectric vibrating piece that vibrates at a predetermined vibration frequency. The piezoelectric vibrating piece is sandwiched between a base plate and a lid plate. In the piezoelectric device, castellations are formed on side faces of the base plate. Wiring electrodes, which are formed on the castellations, electrically connect mounting terminals and excitation electrodes together.

For example, Japanese Unexamined Patent Application Publication No. 6-343017 discloses the following piezoelectric device. The piezoelectric device includes through-holes formed on its base plate. Electrodes are formed inside the through-holes. The electrodes electrically bond electrodes on the front side of the base plate and electrodes on the back side of the base plate together. The through-holes are etched from both the front and back sides of the base plate. This forms the through-holes to have intermediate portions that protrude to outside of the base plate. That is, the through-holes are formed to include intermediate portions with small radii. In the castellations, similarly to the through-holes, intermediate portions of the castellations are formed to protrude to outside of the base plate. Then, the castellations include a surface toward the front side direction and a surface toward the back side direction of the base plate. Accordingly, these electrodes are formed on the castellations by sputtering, vacuum-deposition or the like from both the front and back sides of the castellations.

On the other hand, it is preferred that manufacturing process of the piezoelectric device be further simplified. Since expensive metal may be used for electrode material, it is preferred that usage of the electrode material be reduced. In the case where sputtering, vacuum-deposition or the like is performed on the castellations of the base plate from one main surface, a manufacturing direction is simplified and usage of the electrode material is reduced.

SUMMARY

The present invention provides a piezoelectric device where an external electrode and a wiring electrode, which extends to an extraction electrode of a piezoelectric vibrating piece, are formed by sputtering, vacuum-deposition, or the like. The present invention also provides methods for manufacturing the piezoelectric devices.

A first aspect of invention is directed to a piezoelectric device. The piezoelectric device includes a piezoelectric vibrating piece, a base plate, and a non-conductive bonding material. The piezoelectric vibrating piece includes a pair of excitation electrodes and a pair of extraction electrodes. The pair of extraction electrodes is extracted from the pair of excitation electrode. The base plate includes a bonding surface with a pair of external electrodes and a mounting surface. The piezoelectric vibrating piece is disposed on the mounting surface. A pair of castellations is hollowed into a side face from the mounting surface to the bonding surface. The base plate includes one of glass and piezoelectric material. The non-conductive bonding material is disposed between the piezoelectric vibrating piece and the base plate. The non-conductive bonding material bonds the piezoelectric vibrating piece and the base plate together. The pair of castellations includes a first surface and a second surface. The first surface extends outward from the mounting surface toward the bonding surface side. The second surface extends outward from the bonding surface toward the mounting surface. The second surface has a smaller area than an area of the first surface. A wiring electrode is disposed on the first surface, the second surface, and a side face of the bonding material. The wiring electrode is of a same electrode layer as the external electrode. The wiring electrode extends from the external electrode to the extraction electrodes.

A second aspect of invention is directed to a method for manufacturing the piezoelectric device. The method includes: preparing a base wafer, preparing a piezoelectric wafer, and bonding the base wafer and the piezoelectric wafer together with bonding material. The base wafer includes a plurality of base plates. The base plate includes a mounting surface on which an external electrode is to be formed and a bonding surface. The bonding surface is opposite side of the mounting surface. The bonding bonds the base wafer and the piezoelectric wafer together with bonding material.

The present invention performs sputtering, vacuum-deposition or the like from one main surface. This ensures a facilitated method for manufacturing the piezoelectric devices.

BRIEF DESCRIPTION OF THE DRAWINGS

FIG. 2A is a cross-sectional view taken along the line A-A of FIG. 1.

FIG. 2B is a plan view of a base plate 120a.

FIG. 2C is a plan view of the base plate 120a illustrating external electrodes 125 and grounding terminals 126.

FIGS. 6A to 6D are diagrams illustrating respective steps of a flowchart of a method for manufacturing the base wafer W120 illustrated in FIG. 5.

FIGS. 7A to 7D are diagrams illustrating respective steps of the flowchart of the method for manufacturing the base wafer W120 illustrated in FIG. 5.

FIG. 8A is a partial cross-sectional view of a wafer where the piezoelectric wafer W130 and the base wafer W120 are bonded together.

FIG. 8B is a partial cross-sectional view of a wafer where the piezoelectric wafer W130 and the lid wafer W110 are bonded together.

FIG. 8C is a partial cross-sectional view of a wafer where electrodes are formed on the base wafer W120.

FIGS. 13A to 13D are diagrams illustrating respective steps of a flowchart of a method for manufacturing the base wafer W220 illustrated in FIG. 12.

FIGS. 14A to 14D are diagrams illustrating respective steps of the flowchart of the method for manufacturing the base wafer W220 illustrated in FIG. 12.

FIGS. 15A to 15C are diagrams illustrating respective steps of the flowchart of the method for manufacturing the base wafer W220 illustrated in FIG. 12.

DETAILED DESCRIPTION

Each embodiment of the present invention is described in detail below by referring to the accompanying drawings. It will be understood that the scope of the disclosure is not limited to the described embodiments, unless otherwise stated.

Configuration of a Piezoelectric Device 100 According to a First Embodiment

Figure 1:
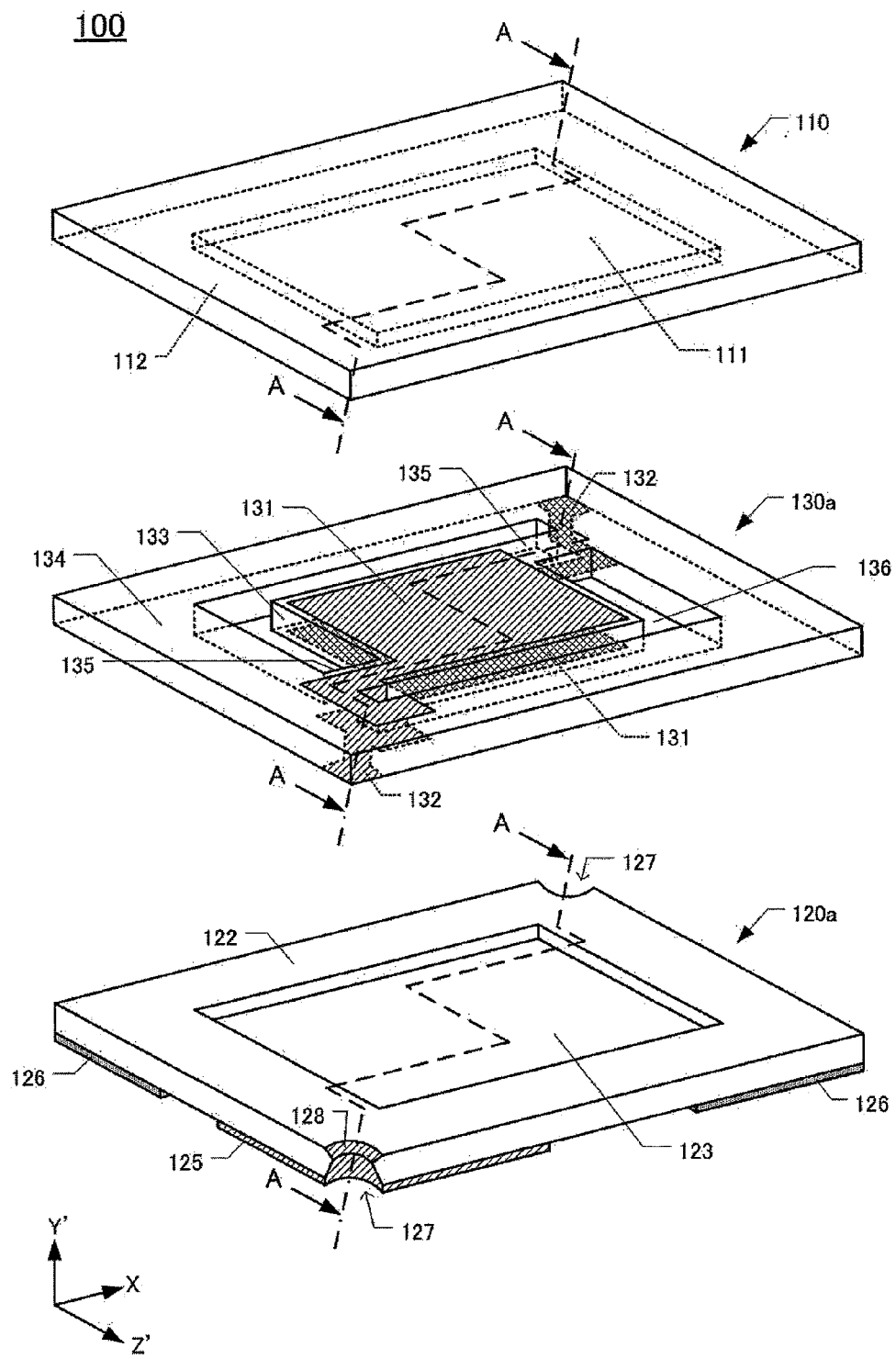
FIG. 1 is an exploded perspective view of a piezoelectric device 100 according to a first embodiment.

FIG. 1 is an exploded perspective view of the piezoelectric device 100. The piezoelectric device 100 is a surface-mount type piezoelectric device. The piezoelectric device 100 is used for being mounted on a printed circuit board or the like. The piezoelectric device 100 mainly includes a lid plate 110, a base plate 120a, and a piezoelectric vibrating piece 130a. The lid plate 110 may be formed of ceramic, glass, piezoelectric material or the like. The base plate 120a may be formed of piezoelectric material such as quartz-crystal material. The piezoelectric vibrating piece 130a employs, for example, an AT-cut quartz-crystal material. The AT-cut quartz-crystal material has a principal surface (in the Y-Z plane) that is tilted by 35° 15' about the Y-axis of the crystal coordinate system (XYZ) in the direction from the Z-axis to the Y-axis around the X-axis. In the following description, the new axises tilted with reference to the axis directions of the AT-cut quartz-crystal material are denoted as the Y' axis and the Z' axis.

Therefore, in the piezoelectric device 100, the longitudinal direction of the piezoelectric device 100 is referred as the X axis direction, the height direction of the piezoelectric device 100 is referred as the Y' axis direction, and the direction perpendicular to the X axis and the Y' axis directions is referred to as the Z' axis direction.

The base plate 120a may be formed in a rectangular shape that has long sides extending in the X axis direction and short sides extending in the Z' axis direction. The base plate 120a has a surface at the −Y' axis side that is a mounting surface on which external electrodes 125 and grounding terminals 126 are to be formed. The external electrodes 125 are electrodes for soldering and electrically connecting the piezoelectric device 100 to a printed circuit board or the like. The grounding terminals 126 are terminals for discharging static electricity and the like, which are charged on the piezoelectric device 100. In the base plate 120a, non-conductive bonding material 140 (see FIGS. 2A to 2C) is applied over a bonding surface 122 on a surface at the +Y' axis side. The base plate 120a is then bonded to the piezoelectric vibrating piece 130a. Further, the base plate 120a includes a recess 123, which is formed to be hollowed into the bonding surface 122 in the −Y' axis direction. The base plate 120a includes a side face of a corner portion at the −X axis side and the +Z' axis side, and a side face of a corner portion at the +X axis side and the −Z' axis side. On these side faces, respective castellations 127 are formed to be recessed inward the base plate 120a. Each of the castellations 127 includes a wiring electrode 128, which is electrically connected to the external electrode 125.

The lid plate 110 is formed in a rectangular shape that has long sides extending in the X axis direction and short sides extending in the Z' axis direction. The lid plate 110 includes a bonding surface 112, which is to be bonded to the piezoelectric vibrating piece 130a via the bonding material 140 (see FIGS. 2A to 2C) on its surface at the −Y' axis side. The lid plate 110 includes a recess 111, which is formed to be hollowed into the bonding surface 112 in the +Y' axis direction.

The piezoelectric vibrating piece 130a includes an excitation unit 133, a framing portion 134, and connecting portions 135. The excitation unit 133 vibrates at a predetermined vibration frequency. The framing portion 134 is formed to surround a peripheral area of the excitation unit 133. The connecting portions 135 connect the excitation unit 133 and the framing portion 134 together. In regions other than the connecting portions 135 between the excitation unit 133 and the framing portion 134, through grooves 136 are formed to pass through the piezoelectric vibrating piece 130a in the Y' axis direction. Further, respective excitation electrodes 131 are formed on surfaces at the +Y' axis side and the −Y' axis side of the excitation unit 133. From the excitation electrode 131 formed at the +Y' axis side, an extraction electrode 132 is extracted via the connecting portion 135 formed at the −X axis side and via side faces at the −X axis side and the +Z' axis side of the through groove 136. The extraction electrode 132 is extracted to a corner portion at the −X axis side and the +Z' axis side on a surface at the −Y' axis side of the framing portion 134. From the excitation electrode 131 formed at the −Y' axis side, an extraction electrode 132 is extracted via the connecting portion 135 formed at the +X axis side. The extraction electrode 132 is extracted to a corner portion at the +X axis side and the −Z' axis side on a surface at the −Y' axis side of the framing portion 134.

FIG. 2A is a cross-sectional view taken along the line A-A of FIG. 1. The piezoelectric device 100 is formed as follows. The bonding surface 122 of the base plate 120a and the surface at the −Y' axis side of the framing portion 134 in the piezoelectric vibrating piece 130a are bonded together via the non-conductive bonding material 140. The bonding surface 112 of the lid plate 110 and the surface at the +Y' axis side of the framing portion 134 in the piezoelectric vibrating piece 130a are bonded via the non-conductive bonding material 140. The bonding material 140 employs, for example, low-melting-point glass, which is a glass bonding material with a melting point equal to or lower than 500 degrees, or resin bonding material such as polyimide resin. Each of the castellations 127 of the base plate 120a includes a first surface 127a and a second surface 127b. The first surface 127a extends outward from a surface at the −Y' axis side of the base plate 120a toward the bonding surface 122 side of the base plate 120a. The second surface 127b extends outward from the bonding surface 122 toward the surface at the −Y' axis side of the base plate 120a. The second surface 127b has a smaller area than that of the first surface 127a. That is, a normal vector of the first surface 127a has a component in the −Y' axis direction, while a normal vector of the second surface 127b has a component in the +Y' axis direction. On the surface at the −Y' axis side of the base plate 120a, the external electrodes 125 are formed. Wiring electrodes 128 are formed on the first surface 127a and the second surface 127b in each castellations 127, and on a side face of the bonding material 140. The external electrodes 125 and the wiring electrodes 128 may be formed of the same electrode layer. The external electrodes 125 and the extraction electrodes 132 of the piezoelectric vibrating piece 130a are electrically connected together via the wiring electrode 128.

FIG. 2B is a plan view of the base plate 120a. Electrodes are not formed on the bonding surface 122 at the +Y' axis side of the base plate 120a. In the castellations 127, the wiring electrodes 128 are formed after the base plate 120a is bonded to the piezoelectric vibrating piece 130a.

FIG. 2C is a plan view of the base plate 120a illustrating the external electrodes 125 and the grounding terminals 126. FIG. 2C is a transparent view of the base plate 120a from the +Y' axis side of the base plate 120a illustrating the external electrodes 125 and the grounding terminals 126, which are formed on the surface at the −Y' axis side of the base plate 120a. The external electrodes 125 are formed to contact the castellation 127. The grounding terminals 126 are formed to include respective corner portions, which do not have the castellations 127, of the base plate 120a. The external electrodes 125 and the grounding terminals 126 are formed to contact the short sides and the long sides of the base plate 120a without spaces.

The bonding material used in the piezoelectric device is affected by heat of, for example, solder when mounted on a printed circuit board or the like. This may break sealing inside the piezoelectric device. In the piezoelectric device 100, the first surface 127a, which has the normal vector with a component in the −Y' axis direction, is formed larger than the second surface 127b. This prevents solder from reaching a portion between the piezoelectric vibrating piece 130a and the base plate 120a. Therefore, this reduces an influence of the solder on the bonding material 140, which is formed between the piezoelectric vibrating piece 130a and the base plate 120a.

A Method for Manufacturing the Piezoelectric Device 100

Figure 3:
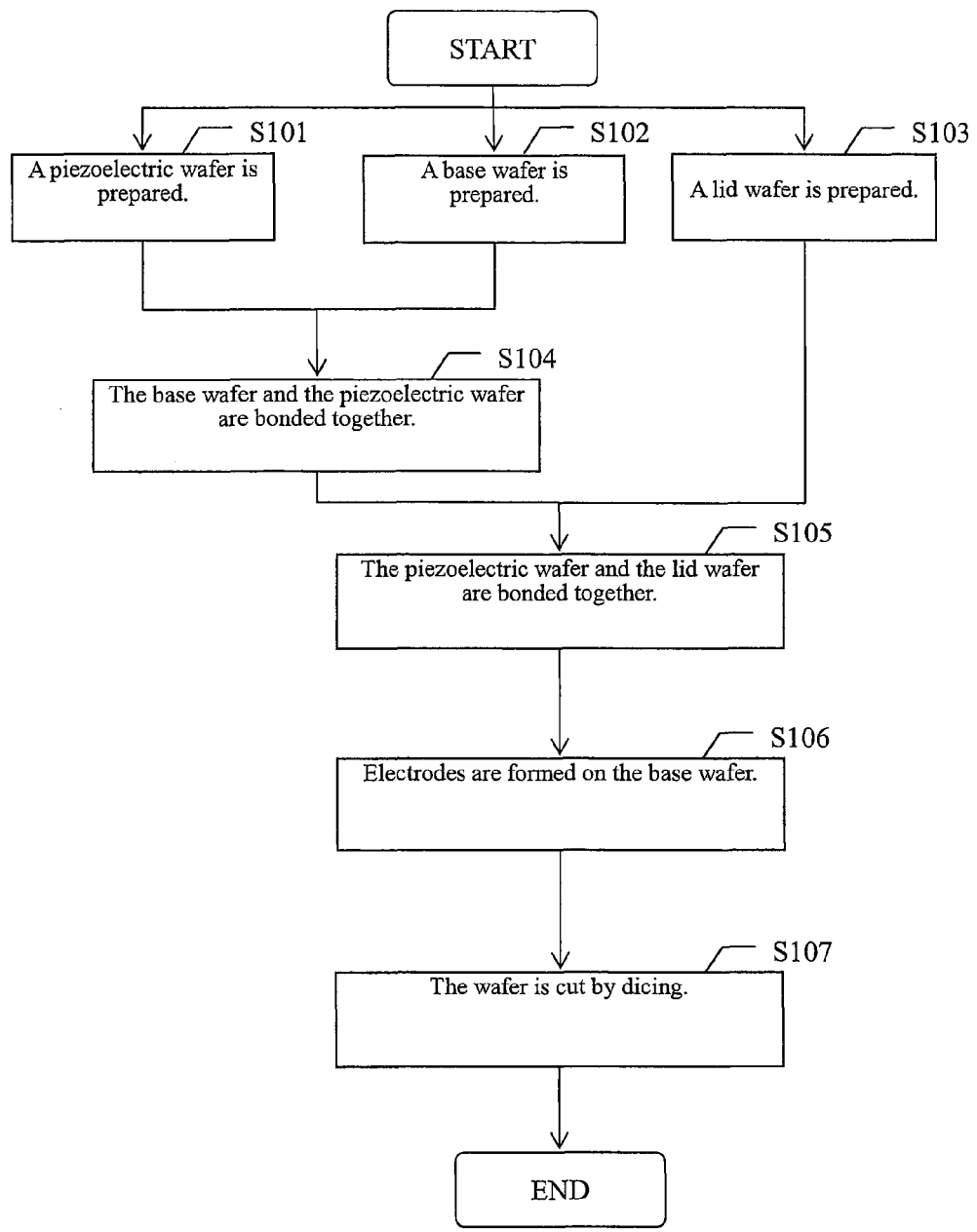
FIG. 3 is a flowchart illustrating a method for manufacturing the piezoelectric device 100.

FIG. 3 is a flowchart illustrating a method for manufacturing the piezoelectric device 100. Hereinafter, the method for manufacturing the piezoelectric device 100 will be described by referring to FIG. 3.

In step S101, a piezoelectric wafer W130 is prepared. The piezoelectric wafer W130 is a wafer formed of piezoelectric material, and includes a plurality of piezoelectric vibrating pieces described below.

Figure 4:
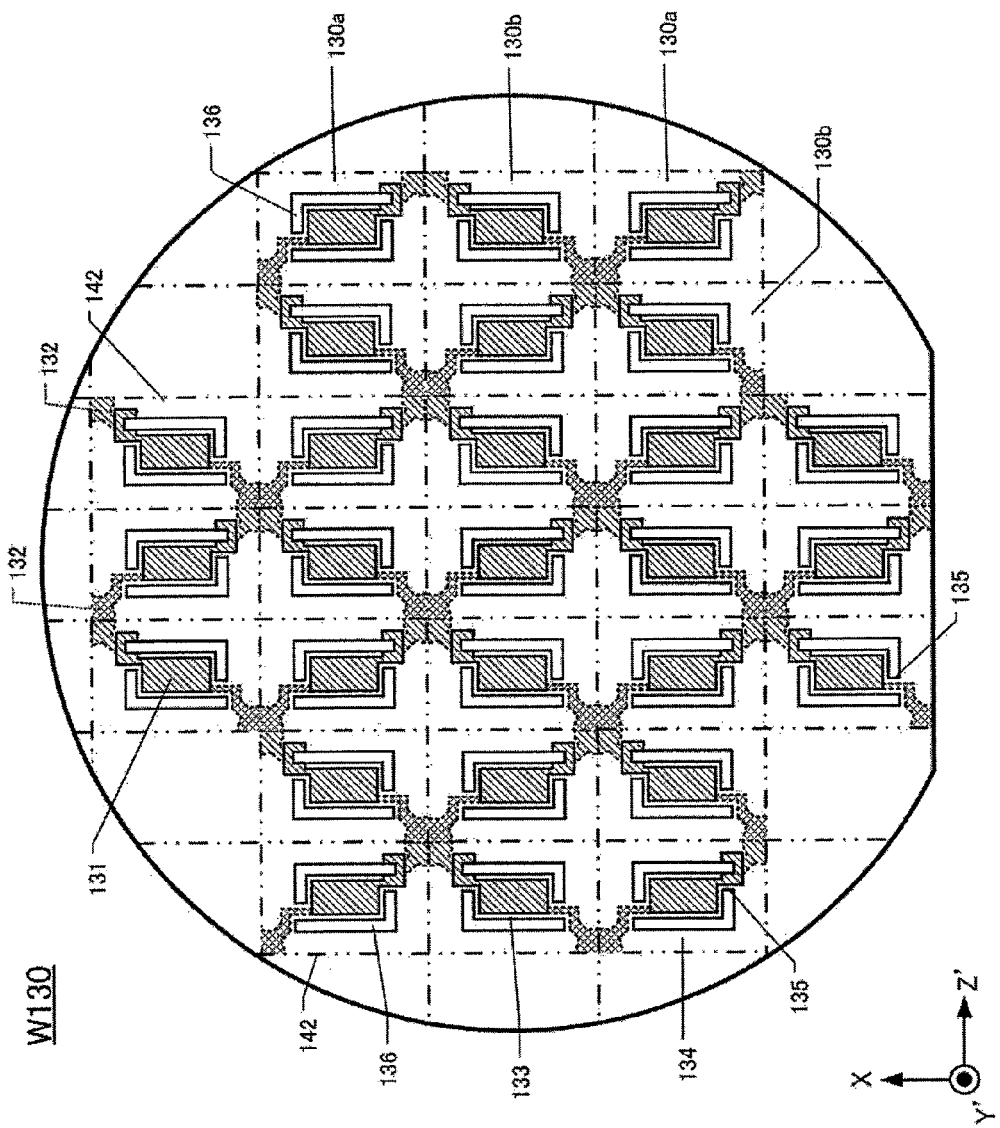
FIG. 4 is a plan view of a piezoelectric wafer W130.

FIG. 4 is a plan view of the piezoelectric wafer W130. In the piezoelectric wafer W130, the piezoelectric vibrating pieces 130a and the piezoelectric vibrating pieces 130b are alternately formed in the X axis direction and the Z' axis direction. In FIG. 4, scribe lines 142 are illustrated by two-dot chain lines at boundaries of the respective piezoelectric vibrating pieces 130a and 130b next to one another. The scribe lines 142 are lines to be used for dicing the wafer in step S107 described later. The piezoelectric vibrating piece 130a is connected to the connecting portion 135 at the +X axis side and the −Z' axis side of the excitation unit 133, and is also connected to the connecting portion 135 at the −X axis side and the +Z' axis side of the excitation unit 133. The piezoelectric vibrating piece 130b is connected to the connecting portion 135 at the +X axis side and the +Z' axis side of the excitation unit 133, and is also connected to the connecting portion 135 at the −X axis side and the −Z' axis side of the excitation unit 133. Accordingly, each piezoelectric vibrating piece 130a includes the extraction electrode 132 that is extracted to a corner portion at the +X axis side and the −Z' axis side and the extraction electrode 132 that is extracted to a corner portion at the −X axis side and the +Z' axis side, on the surface at the −Y' axis side of the framing portion 134. Each piezoelectric vibrating piece 130b includes the extraction electrode 132 that is extracted to a corner portion at the +X axis side and the +Z' axis side and the extraction electrode 132 that is extracted to a corner portion at the −X axis side and the −Z' axis side, on the surface at the −Y' axis side of the framing portion 134. The piezoelectric vibrating pieces 130a and the piezoelectric vibrating pieces 130b are only different in positions of the connecting portion 135, extracting direction of the extraction electrode 132, and the like. The piezoelectric vibrating pieces 130a and the piezoelectric vibrating pieces 130b have the same electrical characteristics.

In step S102, a base wafer W120 is prepared. The base wafer W120 includes the recesses 123 and through-holes 143, which pass through the base wafer W120 in the Y' axis direction. This forms a plurality of base plates described below on the base wafer W120.

Figure 5:
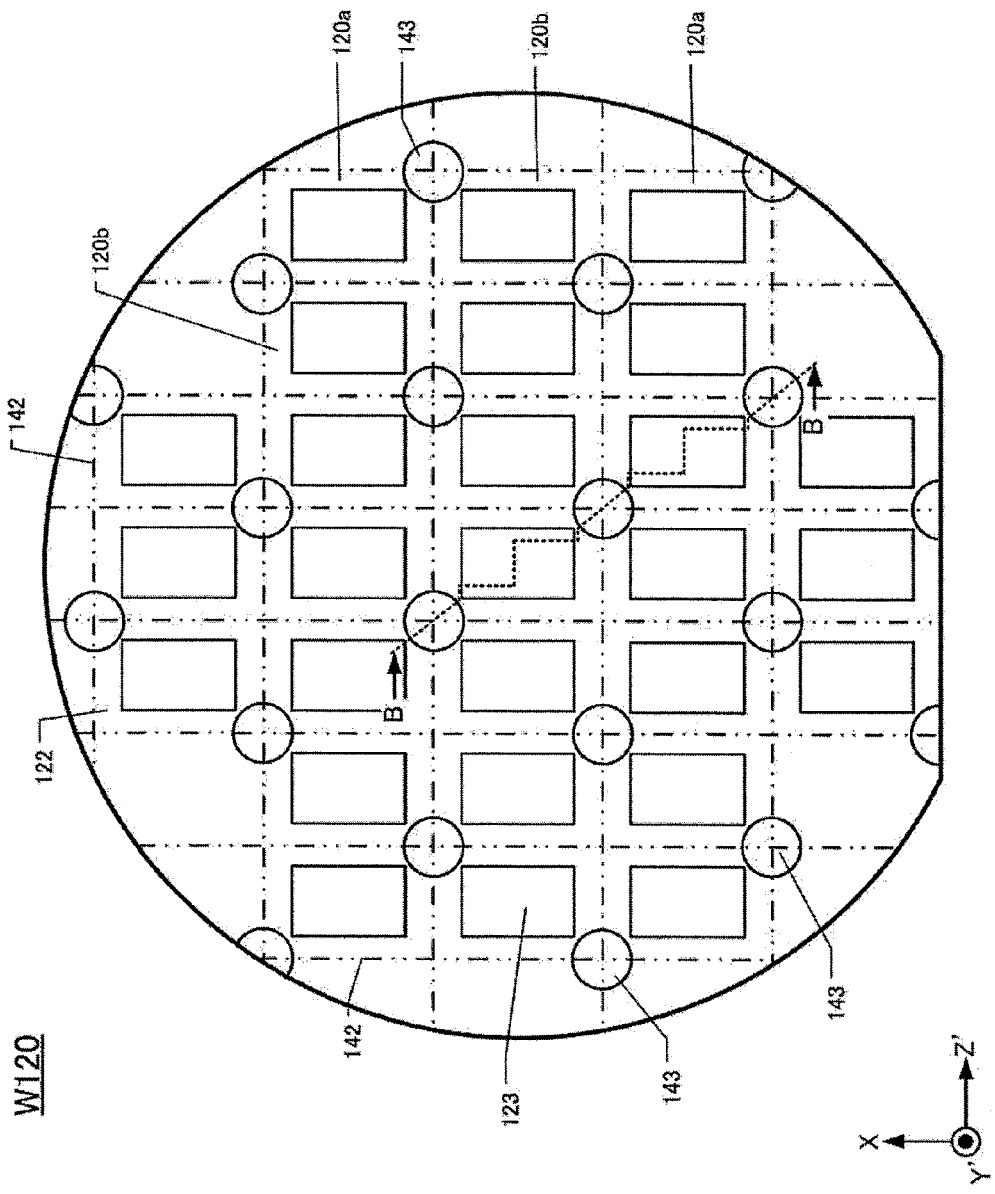
FIG. 5 is a plan view of a base wafer W120.

FIG. 5 is a plan view of the base wafer W120. In the base wafer W120, the base plates 120a and base plates 120b are alternately formed in the X axis direction and the Z' axis direction. FIG. 5 illustrates the scribe lines 142 with the two-dot chain lines at boundaries of the respective base plates 120a and 120b next to one another. The scribe lines 142 are lines to be used for dicing the wafer in step S107 described later. At intersection points of the scribe lines 142 that extend in the X axis direction and the Z' axis direction, the through-holes 143, which pass through the base wafer W120 in the Y' axis direction, are formed at every other intersection point in the X axis direction and the Z' axis direction. In each base plate 120a, the through-holes 143 are formed at the +X axis side and the −Z' axis side, and formed at the −X axis side and the +Z' axis side. In each base plate 120b, the through-holes 143 are formed at the +X axis side and the +Z' axis side, and formed at the −X axis side and the −Z' axis side. The through-holes 143 make the castellations 127 after the wafer is diced in step S107 described later.

FIGS. 6A to 6D and 7A to 7D are diagrams illustrating respective steps of a flowchart of a method for manufacturing the base wafer W120 in FIG. 5. In the right side of respective steps in FIGS. 6A to 6D and 7A to 7D, diagrams to describe the respective steps are illustrated. These diagrams, which describe the respective steps in FIGS. 6A to 6D and 7A to 7D, are cross-sectional views corresponding to cross-sectional surfaces of the base wafer W120 taken along the line B-B of FIG. 5. The method for manufacturing the base wafer W120 will be described below by referring to FIGS. 6A to 6D and 7A to 7D.

In step S201 of FIGS. 6A to 6D, a wafer formed of piezoelectric material is prepared. FIG. 6A illustrates a partial cross-sectional view of the base wafer W120, which is formed of piezoelectric material such as quartz crystal. The base wafer W120, which is prepared in step S201, has surfaces at the +Y' axis side and the −Y' axis side, which are formed to be planar surfaces as illustrated in FIG. 6A.

In step S202, anticorrosion films 150 and photoresists 151 are formed on both the surfaces at the +Y' axis side and the −Y' axis side of the base wafer W120. FIG. 6B is a partial cross-sectional view of the base wafer W120 with the anticorrosion films 150 and the photoresists 151 on both surfaces at the +Y' axis side and the −Y' axis side. First, the anticorrosion films 150 are formed on the surfaces at the +Y' axis side and the −Y' axis side of the base wafer W120. Further, the photoresists 151 are formed on surfaces of the anticorrosion films 150. The anticorrosion films 150 are formed by sputtering, evaporation, or the like of metal films on the base wafer W120. For example, the anticorrosion films 150 are formed as follows. On the base wafer W220, a film of Nickel (Ni), Chromium (Cr), Titanium (Ti), Nickel-Tungsten (NiW), or the like is formed as a foundation. On the foundation, a film of gold (Au), silver (Ag), or the like is then formed. The photoresists 151 are uniformly applied over the surfaces of the anticorrosion films 150 by a technique of spin coat or the like.

In step S203, the photoresists 151 are exposed and developed, and the anticorrosion films 150 are etched. FIG. 6C is a partial cross-sectional view of the base wafer W120 where the photoresists 151 and the anticorrosion films 150 are partially removed on the surface at the −Y' axis side. Regions where the photoresists 151 and the anticorrosion films 150 are removed in step S203 are regions 144. In the regions 144, the through-holes 143 are formed on the surface at the −Y' axis side of the base wafer W120. The regions 144 are formed in a circular shape, and their diameters are formed to be a length WX1.

In step S204, the base wafer W120 is etched by wet etching. This partially forms the through-holes 143. FIG. 6D is a partial cross-sectional view of the base wafer W120 where the through-holes 143 are partially etched by wet etching. In step S204, a piezoelectric material, which is exposed in the regions 144 in step S203, is etched by wet etching. This forms first through-holes 143a, which are each a part of the through-hole 143, on a surface at the −Y' axis side of the base wafer W120. The piezoelectric material may have an anisotropic nature in etching. It is difficult for etchant to circulate deep into the first through-holes 143a in the base wafer W120. Thus, the first through-holes 143a are formed to have smaller opening diameters as the first through-hole 143a becomes deeper in the +Y' axis direction. Assume that the diameter of the first through-hole 143a is a length WX2, and the length WX1 is larger than the length WX2. Depth of the first through-hole 143a in the Y' axis direction is formed to be a first distance HY1. The first through-hole 143a forms the first surfaces 127a of the castellations 127 in the base plate (see FIGS. 2A to 2C).

In step S205 of FIG. 7A, the anticorrosion films 150 and the photoresists 151 are formed on both main surfaces that are surfaces at the +Y' axis side and the −Y' axis side of the base wafer W120. Step S205 in FIG. 7A is a step which is sequentially performed after step S204 in FIG. 6D. FIG. 7A is a partial cross-sectional view of the base wafer W120 where the anticorrosion films 150 and the photoresists 151 are formed on surfaces at the +Y' axis side and the −Y' axis side. After step S204, the anticorrosion films 150 and the photoresists 151 on the base wafer W120 are all removed. The anticorrosion films 150 and the photoresists 151 are again formed on whole surfaces at the +Y' axis side and the −Y' axis side of the base wafer W120.

In step S206, the photoresists 151 are exposed and developed, and the anticorrosion films 150 are etched. FIG. 7B is a partial cross-sectional view of the base wafer W120 where the photoresists 151 are exposed and developed, and the anticorrosion films 150 are etched. The anticorrosion films 150 and the photoresists 151 to be removed are located in regions 145 and regions 146. The region 145 is region where the through-hole 143 on the surface at the +Y' axis side of the base wafer W120 is formed. The region 146 is a region where the recess 123 is formed. The regions 145 are each formed to be in a circular shape with a diameter of a length WX3, which is longer than the length WX2.

In step S207, the base wafer W120 is etched by wet etching. This partially forms the recesses 123 and the through-holes 143. FIG. 7C is a partial cross-sectional view of the base wafer W120 where parts of the through-holes 143 and the recesses 123 are formed by wet etching. In step S207, the piezoelectric material exposed at the regions 145 and the regions 146 in step S206 are etched by wet etching. This forms second through-holes 143b that are the parts of the through-holes 143 and the recesses 123 on the surface at the +Y' axis side of the base wafer W120. The second through-holes 143b are formed to have smaller opening diameters as the second through-holes 143b becomes deeper in the −Y' axis direction. Depths of the second through-holes 143b in the Y' axis direction are each formed to be a second distance HY2, which is shorter than the first distance HY1. Forming the second through-holes 143b forms the second surfaces 127b (see FIGS. 2A to 2C) of the castellations 127 in the base plate.

In step S208, the photoresists 151 and the anticorrosion films 150 are removed. FIG. 7D is a partial cross-sectional view of the base wafer W120 where the photoresists 151 and the anticorrosion films 150 are removed. FIG. 7D is a cross-sectional view taken along the line B-B of FIG. 5. In step S208, the photoresists 151 and the anticorrosion films 150 are removed. This prepares the base wafer W120 including the recesses 123 and the through-holes 143. The through-holes 143 each include the first surface 127a and the second surface 127b, and also include an intermediate portion 127c between the first surface 127a and the second surface 127b. The through-holes 143 are each formed to have the intermediate portion 127c with a diameter of the length WX2.

Returning to FIG. 3, in step S103, a lid wafer W110 is prepared. In the lid wafer W110, the recesses 111 are formed on the surface at the −Y' axis side. This forms a plurality of lid plates 110 in the lid wafer W110.

In step S104, the base wafer W120 and the piezoelectric wafer W130 are bonded together. Step S104 is a bonding step. FIG. 8A is a partial cross-sectional view of a wafer where the piezoelectric wafer W130 and the base wafer W120 are bonded together. FIG. 8A illustrates a cross-sectional view taken along the line B-B of FIG. 5. The base wafer W120 and the piezoelectric wafer W130 are bonded such that the bonding surface 122 of the base wafer W120 is bonded to the surface at the −Y' axis side of the framing portion 134 in the piezoelectric wafer W130 via the bonding material 140. At this time, the bonding material 140 is not formed on the extraction electrodes 132, which face the through-holes 143. The base wafer W120 and the piezoelectric wafer W130 are bonded together such that the piezoelectric vibrating piece 130a overlaps with the base plate 120a, while the piezoelectric vibrating piece 130b overlaps with the base plate 120b.

In step S105, the piezoelectric wafer W130 and the lid wafer W110 are bonded together. FIG. 8B is a partial cross-sectional view of a wafer where the piezoelectric wafer W130 and the lid wafer W110 are bonded together. The lid wafer W110 and the piezoelectric wafer W130 are bonded such that the bonding surface 112 of the lid wafer W110 is bonded to the surface at the +Y' axis side of the framing portion 134 in the piezoelectric wafer W130 via the bonding material 140.

In step S106, electrodes are formed on the base wafer W120. FIG. 8C is a partial cross-sectional view of a wafer where the electrodes are formed on the base wafer W120. Step S106 is a wiring forming step. A metal film is formed on a surface at the −Y' axis side of the base wafer W120 by sputtering, vacuum-deposition, or the like. This forms the grounding terminals 126, the external electrodes 125, and the wiring electrodes 128 on the base wafer W120. For example, the metal film is formed by forming a chromium (Cr) film and further forming a gold (Au) film on the chromium film on the base wafer W120 through a mask 147. The external electrodes 125 and the wiring electrodes 128 are formed in the same step. Thus, the external electrodes 125 and the wiring electrodes 128 may be formed of the same metal films that are continuously connected together. The openings at the +Y' axis side of the through-holes 143 are closed by the framing portion 134 of the piezoelectric wafer W130. This forms the metal film over all the through-holes 143. Further, the metal film is also formed on the surfaces, which are exposed toward the through-holes 143, of the bonding material 140 and the extraction electrodes 132. Accordingly, step S106 electrically connects the external electrodes 125, the wiring electrodes 128, and the extraction electrodes 132 together.

In step S107, the wafer with the electrodes formed in step S106 is cut by dicing. In the step S107, the wafer is diced using a dicing saw (not shown) or the like along the scribe lines 142 in FIG. 4, FIG. 5, and FIG. 8A to FIG. 8C. This cuts the wafer into the individual piezoelectric devices 100.

In the method for manufacturing the piezoelectric device 100, sputtering or vacuum-deposition is not performed on the surface at the +Y' axis side of the base wafer W120. This preferably facilitates the manufacturing process. Sputtering or vacuum-deposition is not performed on the surface at the +Y' axis side of the base wafer W120. This preferably reduces usage of the electrode material. Further, in the through-holes 143 of the base plate, the first surfaces 127a, which each have the normal vector with a component in the −Y' axis direction, are formed to have larger area than those of the second surfaces 127b. This facilitates performing evaporation of the metal film on the through-holes 143 with the large first surfaces 127a from the −Y' axis side of the base wafer W120. The second surfaces 127b are each formed to have a small area and have the opening at the +Y' axis side of the through-hole 143 closed by the framing portion 134 of each piezoelectric vibrating piece. This facilitates forming the metal film also on the second surface 127b. That is, in the piezoelectric device 100, forming the electrodes on the through-holes 143 is facilitated.

Second Embodiment

The base plate may employ glass as base material. Glass does not have an anisotropic nature in wet etching. Thus, in the case where the base plate employs glass as base material, the castellations have different shapes from those of the castellations in the first embodiment. A piezoelectric device where the base plate that employs glass as base material is used will be described below. In the following description, like reference numerals designate corresponding or identical elements of the piezoelectric vibrating piece in the first the embodiment, and therefore such elements will not be further elaborated here.

Configuration of a Piezoelectric Device 200

Figure 9:
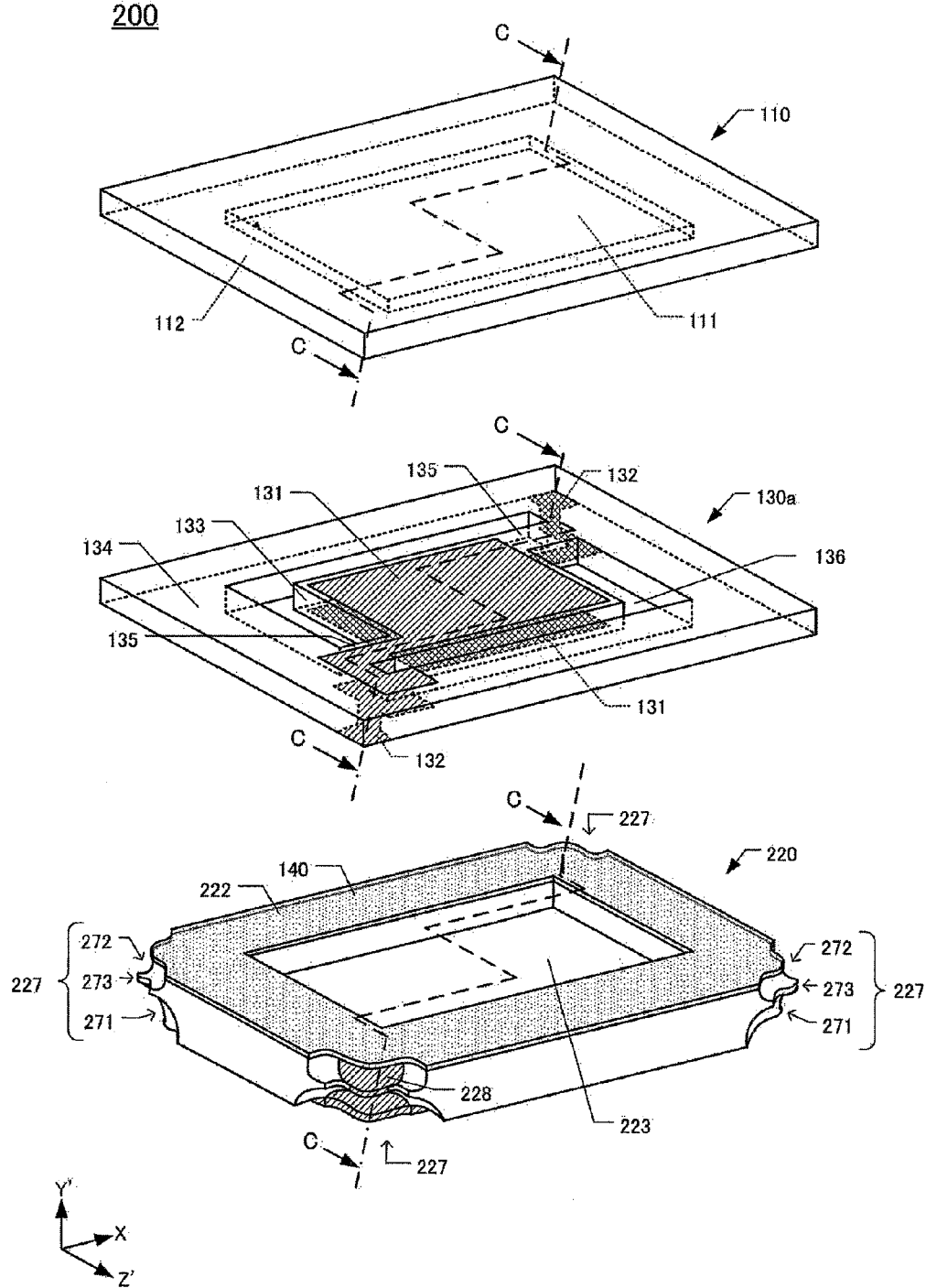
FIG. 9 is an exploded perspective view of a piezoelectric device 200 according to a second embodiment.

FIG. 9 is an exploded perspective view of the piezoelectric device 200. The piezoelectric device 200 mainly includes the lid plate 110, a base plate 220, and the piezoelectric vibrating piece 130a. In the piezoelectric device 200, the base plate 220 employs glass as base material.

The base plate 220 is formed in a rectangular that has long sides extending in the X axis direction and short sides extending in the Z' axis direction. The base plate 220 has a surface at the −Y' axis side that is a mounting surface on which the external electrodes 225 (see FIG. 10A) and the grounding terminals 226 (see FIG. 10C) are to be formed. The external electrodes 225 are electrodes for soldering and electrically connecting the piezoelectric device 200 to a printed circuit board or the like. The grounding terminals 226 are terminals for discharging static electricity and the like, which are charged on the piezoelectric device 200. The bonding material 140 is applied over a bonding surface 222 at the +Y' axis side of the base plate 220. Then, the base plate 220 is bonded to the piezoelectric vibrating piece 130a. Further, the base plate 220 includes a recess 223, which is formed to be hollowed into the bonding surface 222 in the −Y' axis direction. On side faces of corner portions at four corners of the base plate 220, castellations 227 are formed to be recessed inward the base plate 220. The castellations 227 are formed to extend to the long sides and the short sides of the base plate 220. Each of the castellations 227 includes a first surface 271, a second surface 272, and a protruding surface 273. The first surface 271 extends outward from the mounting surface toward the bonding surface 222 side. The second surface 272 extends outward from the bonding surface 222 toward the mounting surface. The second surface 272 has a smaller area than that of the first surface 271. The protruding surface 273 is disposed between the first surface 271 and the second surface 272. The protruding surface 273 protrudes outside of the base plate 220 farther than the first surfaces 271 and the second surfaces 27. On the respective castellations 227, wiring electrodes 228 are formed. The wiring electrodes 228 are electrically connected to the external electrodes 225.

Figure 10A:
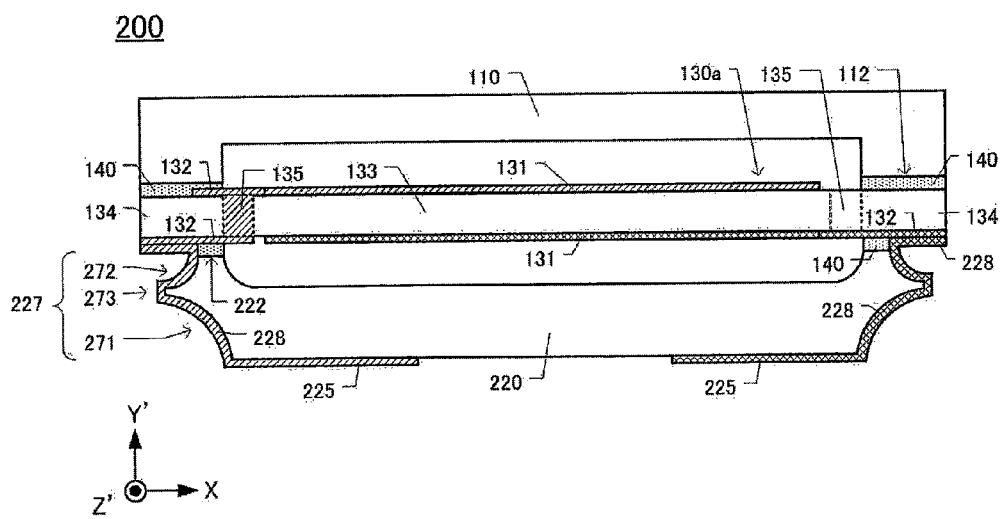
FIG. 10A is a cross-sectional view taken along the line C-C of FIG. 9.

FIG. 10A is a cross-sectional view taken along the line C-C of FIG. 9. The piezoelectric device 200 is formed as follows. The bonding surface 222 of the base plate 220 and the surface at the −Y' axis side of the framing portion 134 in the piezoelectric vibrating piece 130a are bonded via the bonding material 140. The bonding surface 112 of the lid plate 110 and the surface at the +Y' axis side of the framing portion 134 in the piezoelectric vibrating piece 130a are bonded via the bonding material 140. Each of the castellations 227 of the base plate 220 includes the first surface 271, the second surface 272, and the protruding surface 273. The first surfaces 271 and the second surfaces 272 are formed as curved surfaces that are hollowed into the base plate 220. The protruding surface 273 is formed to protrude outside the base plate 220. On the surface at the −Y' axis side of the base plate 220, grounding terminals 226 (see FIG. 10C) and the external electrodes 225 are formed. On the castellations 227, the wiring electrodes 228 are formed. The wiring electrodes 228 and the external electrodes 225 may be formed of the same electrode layer that are continuously connected together. The wiring electrode 228 electrically connects the external electrode 225 and the extraction electrode 132, which is formed on the framing portion 134 of the piezoelectric vibrating piece 130a, together.

Figure 10B:
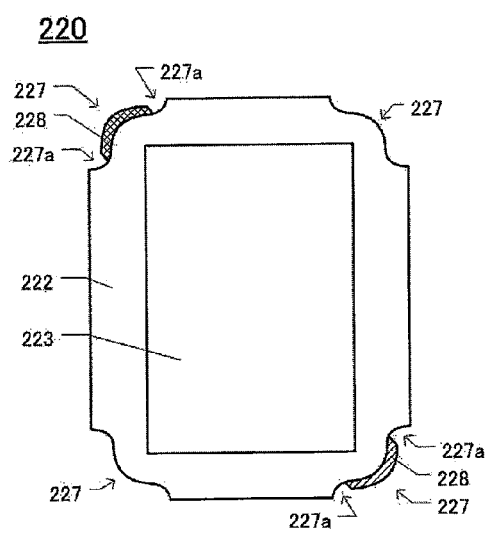
FIG. 10B is a plan view of a base plate 220.

FIG. 10B is a plan view of the base plate 220. The surface at the +Y' axis side of the base plate 220 does not have any electrode. On the castellations 227 at the +X axis side and the −Z' axis side and castellations 227 at the −X axis side and the +Z' axis side of the base plate 220, the wiring electrodes 228 are formed after the base plate 220 is bonded to the piezoelectric vibrating piece 130a. The wiring electrode 228 formed on the castellations 227 are formed not to contact short sides parallel to the Z' axis of the base plate 220 or long sides parallel to the X axis. That is, in the X-Z' plane, the wiring electrodes 228 are not formed on end portions 227a, which are in contact with the short sides or long sides in the base plate 220, of the castellations 227. At the end portions 227a of the castellations 227, the glass is exposed outside.

Figure 10C:
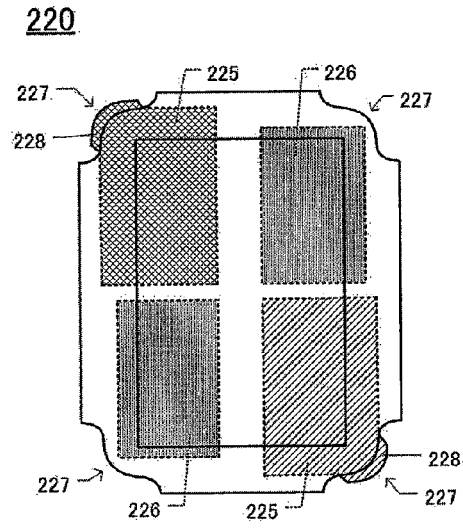
FIG. 10C is a plan view of the base plate 220 illustrating external electrodes 225 and grounding terminals 226.

FIG. 10C is a plan view of the base plate 220 illustrating the external electrodes 225 and the grounding terminals 226. FIG. 10C is a transparent view of the base plate 220 from the +Y' axis side of the base plate 220 illustrating the external electrodes 225 and the grounding terminals 226, which are formed on the surface at the −Y' axis side of the base plate 220. The external electrodes 225 are formed to contact the castellations 227 but not to contact the short sides or the long sides of the base plate 220. The grounding terminals 226 are formed not to contact the short sides of the base plate 220, the long sides of the base plate 220, or the castellations 227.

The piezoelectric device 200 includes the first surfaces 271 of the castellations 227 in the base plate 220. The first surfaces 271 have the curved surfaces hollowed into the base plate 220. This prevents solder from reaching the bonding surface 222 in the case where the piezoelectric device 200 is mounted on a printed circuit board or the like, thus appropriately reducing an influence of the solder on the bonding material 140. In the piezoelectric device 200, the second surfaces 272 are each formed to have a small area. This forms the bonding surfaces 222 with a large area in the base plate 220. Accordingly, the bonding material 140 preferably has a large forming area.

A Method for Manufacturing the Piezoelectric Device 200

The piezoelectric device 200 is formed in accordance with the flowchart of FIG. 3, similarly to the piezoelectric device 100. The method for manufacturing the piezoelectric device 200 will be described below by referring to FIG. 3.

In step S101, a piezoelectric wafer W230 is prepared. The piezoelectric wafer W230 is a wafer formed of glass, and includes a plurality of piezoelectric vibrating pieces 130a.

Figure 11:
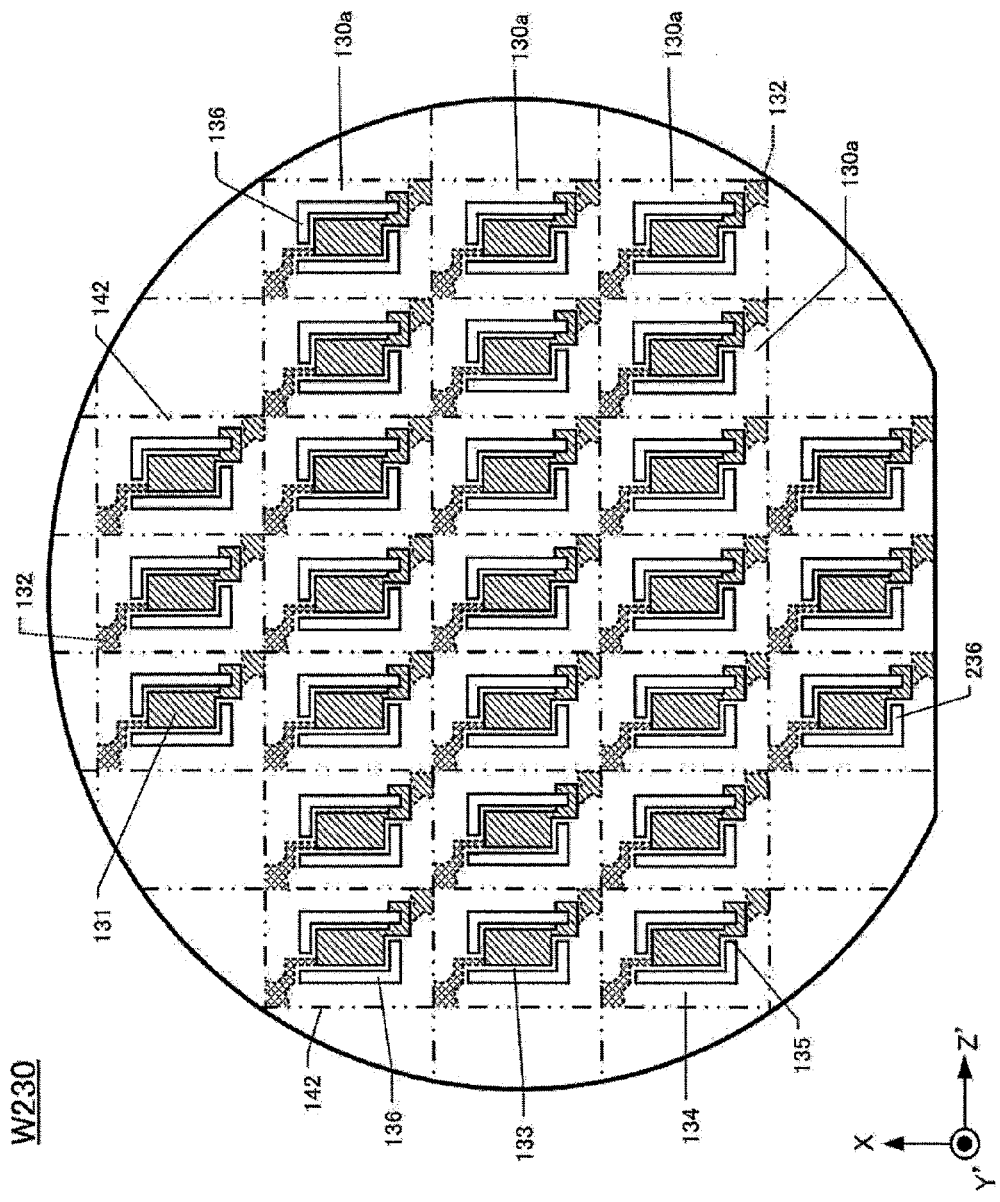
FIG. 11 is a plan view of a piezoelectric wafer W230.

FIG. 11 is a plan view of the piezoelectric wafer W230. In the piezoelectric wafer W230, the piezoelectric vibrating pieces 130a are arranged in the X axis direction and the Z' axis direction. FIG. 11 illustrates the scribe lines 142 by two-dot chain lines at boundaries of the respective piezoelectric vibrating pieces 130a next to one another. The extraction electrodes 132 of each piezoelectric vibrating piece 130a in FIG. 11 are not electrically connected to the extraction electrodes 132 of another piezoelectric vibrating piece 130a.

In step S102, the base wafer W220 is prepared. The base wafer W220 includes the recesses 223 and through-holes 243, which pass through the base wafer W220 in the Y' axis direction. This forms a plurality of base plates 220 in the base wafer W220.

Figure 12:
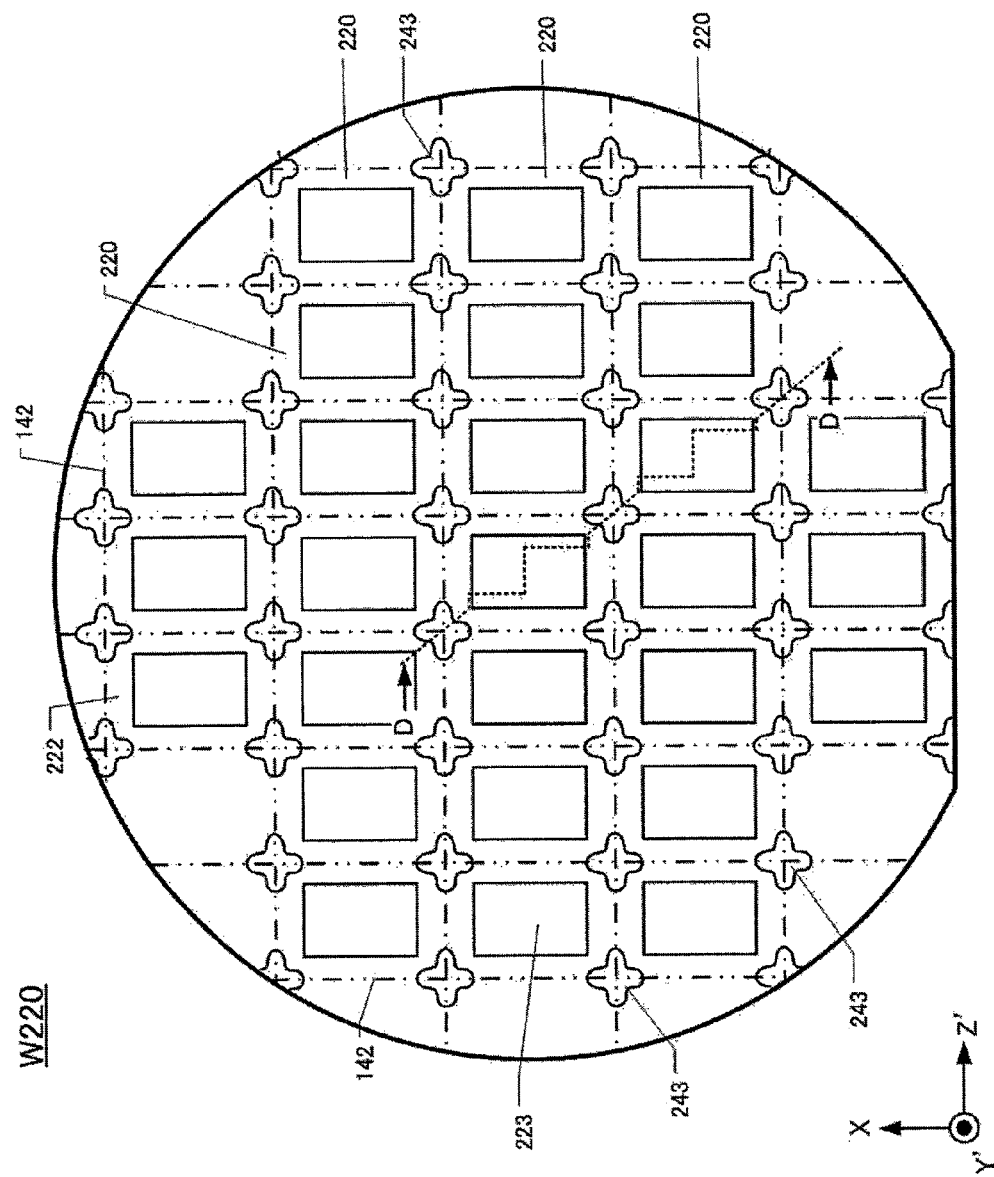
FIG. 12 is a plan view of the base wafer W220.

FIG. 12 is a plan view of the base wafer W220. The base wafer W220 includes the base plates 220 that are arranged in the X axis direction and the Z' axis direction. FIG. 12 illustrates the scribe lines 142 by two-dot chain lines at boundaries of the respective the base plates 220 next to one another. At intersection points of the scribe lines 142 that extend in the X axis direction and the Z' axis direction, the through-holes 243 are formed. The through-holes 243 pass through the base wafer W220 in the Y' axis direction, and extend in the X axis direction and the Z' axis direction along the scribe lines 142. Thus, the through-holes 243 are formed in the four corners of the respective the base plates 220. The through-holes 243 make the castellations 227 after the wafer is diced in step S107 described later.

FIGS. 13A to 13D, 14A to 14D, and 15A to 15C are diagrams illustrating respective steps of a flowchart of a method for manufacturing the base wafer W220 in FIG. 12. In the right side of respective steps in FIGS. 13A to 13D, 14A to 14D, and 15A to 15C, diagrams to describe the respective steps are illustrated. These diagrams, which describe the respective steps in FIGS. 13A to 13D, 14A to 14D, and 15A to 15C, are cross-sectional views corresponding to cross-sectional surfaces of the base wafer W220 taken along the line D-D of FIG. 12. The method for manufacturing the base wafer W220 will be described below by referring to FIGS. 13A to 13D, 14A to 14D, and 15A to 15C.

In step S211 of FIG. 13A, a wafer formed of glass is prepared. FIG. 13A illustrates a partial cross-sectional view of the base wafer W220 formed of glass. The wafer prepared in step S211 has planar surfaces at the +Y' axis side and the −Y' axis side as illustrated in FIG. 13A.

In step S212, the anticorrosion films 150 and the photoresists 151 are formed on both the surfaces at the +Y' axis side and the −Y' axis side of the base wafer W220. FIG. 13B illustrates a partial cross-sectional view of the base wafer W220 with the anticorrosion films 150 and the photoresists 151. As illustrated in FIG. 13B, the anticorrosion films 150 are formed on the surfaces at the +Y' axis side and the −Y' axis side of the base wafer W220. Further, the photoresists 151 are formed on surfaces of the anticorrosion films 150. The anticorrosion films 150 are formed by sputtering, vacuum-deposition, or the like of metal films on the base wafer W220. For example, the anticorrosion films 150 are formed as follows. On the base wafer W220, a film of Nickel (Ni), Chromium (Cr), Titanium (Ti), Nickel-Tungsten (NiW), or the like is formed as a foundation. On the foundation, a film of gold (Au), silver (Ag), or the like is then formed. The photoresists 151 are uniformly applied over the surfaces of the anticorrosion films 150 by a technique of spin coat or the like.

In step S213, the photoresists 151 are exposed and developed. FIG. 13C illustrates a partial cross-sectional view of the base wafer W220 where the photoresists 151 are exposed and developed. Portions where the photoresists 151 are exposed and developed in step S213 form recessed regions 160 and penetration regions 161. The recessed regions 160 are regions that correspond to the recesses 223 (see FIG. 9) on the surface at the +Y' axis side of the base wafer W220. The penetration regions 161 are regions that correspond to the through-holes 243 on the surface at the −Y' axis side of the base wafer W220. In the case where the base material of the base wafer W220 is glass, regions that are etched by wet etching in the base wafer W220 are expanded. Thus, the recessed regions 160 and the penetration regions 161 are formed to be smaller than the respective regions of the recesses 223 and the through-holes 243. Assume that a width in the X axis direction of the penetration region 161 is a width WA1, it is preferred that the width WA1 be formed to ensure the small through-holes 243, so as not to make the through-holes 243 excessively large.

In step S214, the anticorrosion films 150 are etched. FIG. 13D illustrates a partial cross-sectional view of the base wafer W220 with the etched anticorrosion films 150. In step S214, the anticorrosion films 150 in the recessed regions 160, where the photoresists 151 are exposed and developed in step S213, and in the penetration regions 161 are removed by etching.

In step S215 of FIG. 14A, the base wafer W220 is etched by wet etching. FIG. 14A illustrates a partial cross-sectional view of the base wafer W220 with etched glass. In step S215, the glass in the recessed regions 160 and the penetration regions 161 are dipped in etchant. This performs wet etching on the recessed regions 160 and the penetration regions 161 so as to each have a depth HA1. In the wet etching on the glass, a portion below the anticorrosion film 150 is also etched. Accordingly, for example, a width WA2 of glass in X axis direction, which is etched in the penetration region 161 becomes larger than the width WA1 (see FIG. 13C) of the penetration region 161 in the X axis direction.

In step S216, the anticorrosion films 150 and the photoresists 151 on the surface at the +Y' axis side of the base wafer W220 are removed. Subsequently, the anticorrosion film 150 is again formed on the surface at the +Y' axis side of the base wafer W220, and the photoresist 151 is then formed on the surface of the anticorrosion film 150. FIG. 14B illustrates a partial cross-sectional view of the base wafer W220 where the anticorrosion film 150 and the photoresist 151 are formed on the surface at the +Y' axis side. The anticorrosion films 150 and the photoresists 151 are formed on the whole surface at the +Y' axis side of the base wafer W220.

In step S217, the photoresist 151 is exposed and developed. FIG. 14C illustrates a partial cross-sectional view of the base wafer W220 where the photoresist 151 on the surface at the +Y' axis side is exposed and developed. Portions where the photoresist 151 is exposed and developed in step S217 are the penetration regions 162 corresponding to the through-holes 243 on the surface at the +Y' axis side. Similarly to the recessed regions 160 and the penetration regions 161, the base wafer W220 has expanded etched regions by wet etching. Accordingly, the penetration regions 162 are formed to be smaller than regions of the through-holes 243 on the surface at the +Y' axis side. A width of the penetration region 162 in the X axis direction is assumed to be a width WA3.

In step S218, the anticorrosion films 150 is etched. FIG. 14D illustrates a partial cross-sectional view of the base wafer W220 with etched anticorrosion films 150. In step S218, the anticorrosion film 150 on the penetration regions 162 are etched to be removed.

In step S219 of FIG. 15A, the base wafer W220 is etched by wet etching. FIG. 15A illustrates a partial cross-sectional view of the base wafer W220 with etched glass. In step S219, the glass exposed in the penetration regions 161 and the penetration regions 162 are dipped in etchant for wet etching. This forms the penetration region 161 to have a depth of a depth HA3, and forms the penetration region 162 to have a depth of a depth HA2. A size of the depth HA3 of the penetration region 161 is a sum of the depth HA1 (see FIG. 14A) and the depth HA2. As a result of the wet etching, a width of the glass in the X axis direction, which is etched by wet etching in each penetration region 162, becomes a width WA5, while a width of the glass in the X axis direction, which is etched by wet etching in each penetration region 161, becomes a width WA4. The width WA5 is larger than the width WA3 (see FIG. 14C), the width WA4 is larger than the width WA2 (see FIG. 14A), and the width WA4 is larger than the width WA5.

In step S220, the anticorrosion films 150 and the photoresists 151 are removed. FIG. 15B illustrates a partial cross-sectional view of the base wafer W220 where the anticorrosion films 150 and the photoresists 151 are removed. In the base wafer W220 of FIG. 15B, the recesses 223 are formed on the respective base plates 220. The glass in a position of each through-hole 243 has a thickness HA4.

In step S221, the through-holes 243 are formed by sand-blasting. FIG. 15C illustrates a partial cross-sectional view of the base wafer W220 where the through-holes 243 are formed by sand-blasting. In step S221, sand-blasting is performed to spray polishing material onto the surface at the −Y' axis side of the base wafer W220. This passes through the through-holes 243, thus forming the protruding surfaces 273. FIG. 15C is a cross-sectional view taken along the line D-D of FIG. 12.

Returning to FIG. 3, in step S103, the lid wafer W110 is prepared. In the lid wafer W110, the recesses 111 are formed on the surface at the −Y' axis side. This forms the plurality of lid plates 110 in the lid wafer W110.

Figure 16A:
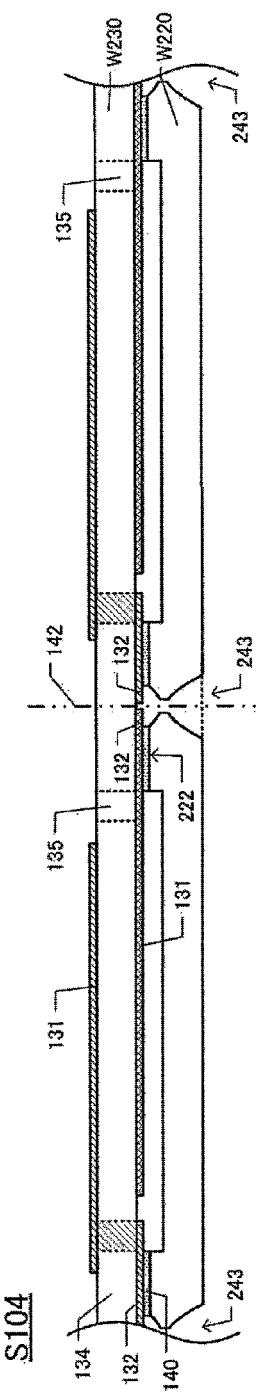
FIG. 16A is a partial cross-sectional view of a wafer where the piezoelectric wafer W230 and the base wafer W220 are bonded together.

In step S104, the base wafer W220 and the piezoelectric wafer W230 are bonded together. Step S104 is a bonding step. FIG. 16A is a partial cross-sectional view of a wafer where the piezoelectric wafer W230 and the base wafer W220 are bonded together. FIG. 16A illustrates a cross-sectional view taken along the line D-D of FIG. 12. The base wafer W220 and the piezoelectric wafer W230 are bonded such that the bonding surface 222 of the base wafer W220 is bonded to the surface at the −Y'axis side of the framing portion 134 in the piezoelectric wafer W230 via the bonding material 140. At this time, the bonding material 140 is not formed on the extraction electrodes 132, which face the through-holes 243. FIG. 16A illustrates that the extraction electrodes 132 are not formed on the scribe lines 142.

Figure 16B:
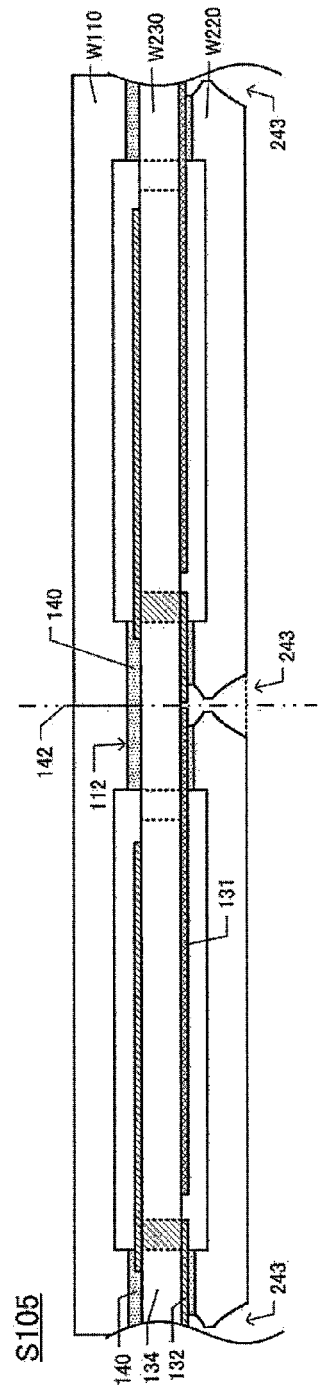
FIG. 16B is a partial cross-sectional view of a wafer where the piezoelectric wafer W230 and the lid wafer W110 are bonded together.

In step S105, the piezoelectric wafer W230 and the lid wafer W110 are bonded together. FIG. 16B is a partial cross-sectional view of a wafer where the piezoelectric wafer W230 and the lid wafer W110 are bonded together. The lid wafer W110 and the piezoelectric wafer W230 are bonded such that the bonding surface 112 of the lid wafer W110 is bonded to the surface at the +Y' axis side of the framing portion 134 in the piezoelectric wafer W230 via the bonding material 140.

Figure 16C:
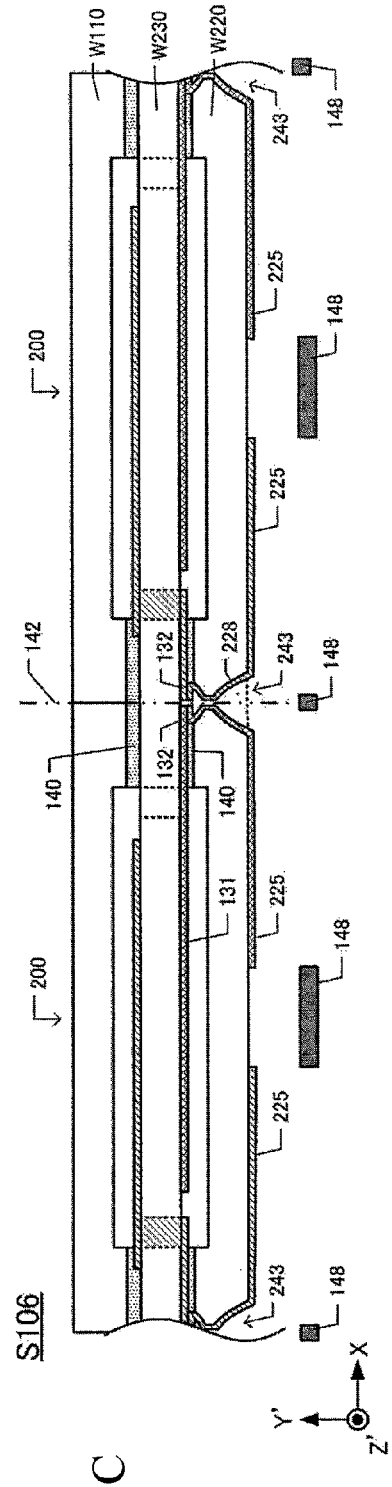
FIG. 16C is a partial cross-sectional view of a wafer where electrodes are formed on the base wafer W220.

In step S106, electrodes are formed on the base wafer W220. FIG. 16C is a partial cross-sectional view of a wafer where the electrodes are formed on the base wafer W220. Step S106 is a wiring forming step. A metal film is formed on the surface at the −Y' axis side of the base wafer W220 by sputtering, vacuum-deposition or the like. This forms the grounding terminals 226, the external electrodes 225, and the wiring electrodes 228 on the base wafer W220. For example, the metal film is formed by forming a chromium (Cr) film and further forming a gold (Au) film on the chromium film on the base wafer W220 through a mask 148. The external electrodes 225 and the wiring electrodes 228 are formed in the same step. Thus, the external electrodes 225 and the wiring electrodes 228 are formed of the same metal film that are continuously connected together. The openings at the +Y' axis side of the through-holes 243 are closed by the framing portion 134 of the piezoelectric wafer W230. This forms the metal film over all the through-holes 243. Further, the metal film is also formed on the surfaces of the bonding material 140 and the extraction electrodes 132, which are both exposed to the through-holes 243. Accordingly, this step S106 electrically connects the external electrodes 225, the wiring electrodes 228, and the extraction electrodes 132 together. This forms a plurality of piezoelectric devices 200 on the wafer. In FIG. 16C, the mask 148 is also arranged on the scribe lines 142. The piezoelectric device 200 includes the adjacent wiring electrodes 228 in the respective through-holes 243. The adjacent wiring electrodes 228 are not electrically connected together.

Figure 17B:
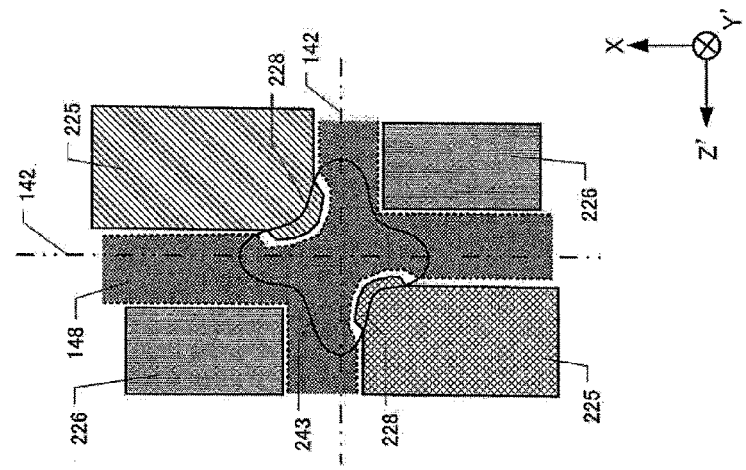
FIG. 17B is an enlarged plan view of the region 171 in FIG. 17A.
Figure 17A:
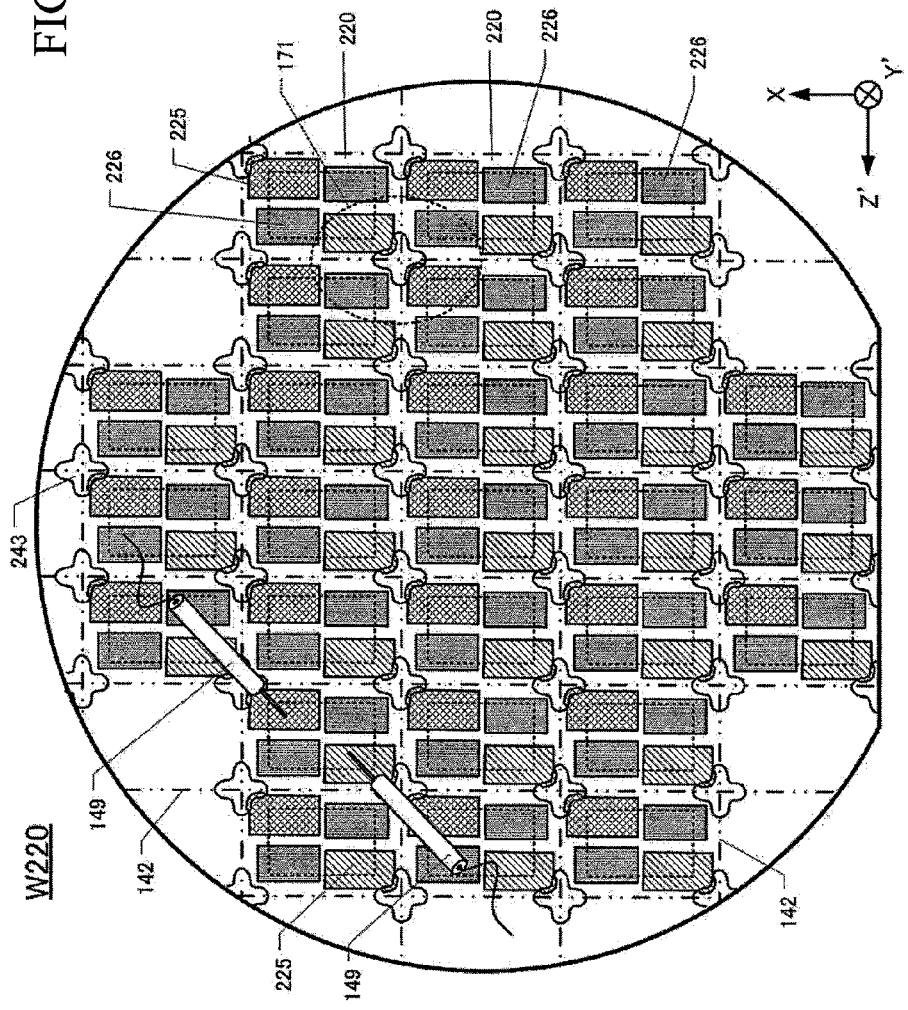
FIG. 17A is a plan view of a surface at the −Y' axis side of the base wafer W220 with electrodes.

FIG. 17A is a plan view of the base wafer W220 illustrating the surface with electrodes at the −Y' axis side. The electrodes on the base wafer W220 are not formed on the scribe lines 142 as illustrated in FIG. 17A. Thus, the grounding terminals 226 and the external electrodes 225 on each base plate 220 are not electrically connected to the grounding terminals 226 or the external electrodes 225 on an adjacent base plate 220. As illustrated in FIG. 16C, the wiring electrodes 228 and the extraction electrodes 132 of the piezoelectric device 200 are not electrically connected to those of an adjacent piezoelectric device 200. Thus, each of the piezoelectric devices 200 on the wafer is not electrically connected to another piezoelectric device 200. Accordingly, as illustrated in FIG. 17A, a pair of probes 149 are brought in contact with a pair of external electrodes 225 on each piezoelectric device 200 after forming the electrodes on the base wafer W220. This allows to check the vibration frequency of each piezoelectric device 200.

FIG. 17B is an enlarged plan view of the region 171 in FIG. 17A. FIG. 17B illustrates a part of the mask 148 used in step S106. The mask 148 includes first openings and second openings. The first openings are openings used to form the external electrodes 225. The second openings are openings used to form the wiring electrodes 228 on the through-hole 243. The first openings are connected to the respective second openings. The first openings each have approximately the same shape as a planar shape of each external electrode 225. The second openings each have a planar shape that is slightly larger toward the through-hole 243 side than a shape of each wiring electrode 228 in the X-Z' plane on the through-holes 243. As illustrated in FIG. 17B, the wiring electrodes 228 are formed on only a part of the through-holes 243. Accordingly, the second opening to form the wiring electrodes 228 has a smaller area than that of the through-hole 243. The mask 148 also has openings to form the grounding terminals 226.

In step S107 of FIG. 3, the wafer on which the electrodes are formed in step S106 is cut by dicing. The dicing is performed using a dicing saw along the scribe lines 142, thus cutting the wafer into the individual piezoelectric devices 200.

In the manufacturing process of the piezoelectric device, while dicing the wafer, the dicing saw possibly catches the electrodes on the piezoelectric device, thus causing delamination of the electrodes. In the case where the dicing saw cuts the electrodes along with the wafer, areas of the electrodes in the respective piezoelectric devices are different in each of the piezoelectric devices due to misalignment of the dicing. This causes a problem in that crystal impedance (CI) value varies among the piezoelectric devices. In the method for manufacturing the piezoelectric device 200, as illustrated in FIGS. 16C and 17B, the wiring electrodes 228 are not formed on the scribe lines 142. This prevents the dicing of wafer from affecting the wiring electrodes 228 of the piezoelectric device 200. This avoids the variation in crystal impedance (CI) value of each piezoelectric device due to uniformity in size of the area of electrodes on each piezoelectric device.

Various shapes of castellations formed on a base plate have been contrived. As modifications of castellations formed on base plates, a base plate 320 and a base plate 420 will be described below. The base plate 320 has castellations that extend from respective corner portions of the base plate in the short side direction. The base plate 420 has castellations that are formed at the short sides of the base plate so as not to include a corner portion of the base plate.
Configuration of the Base Plate 320

Figure 18A:
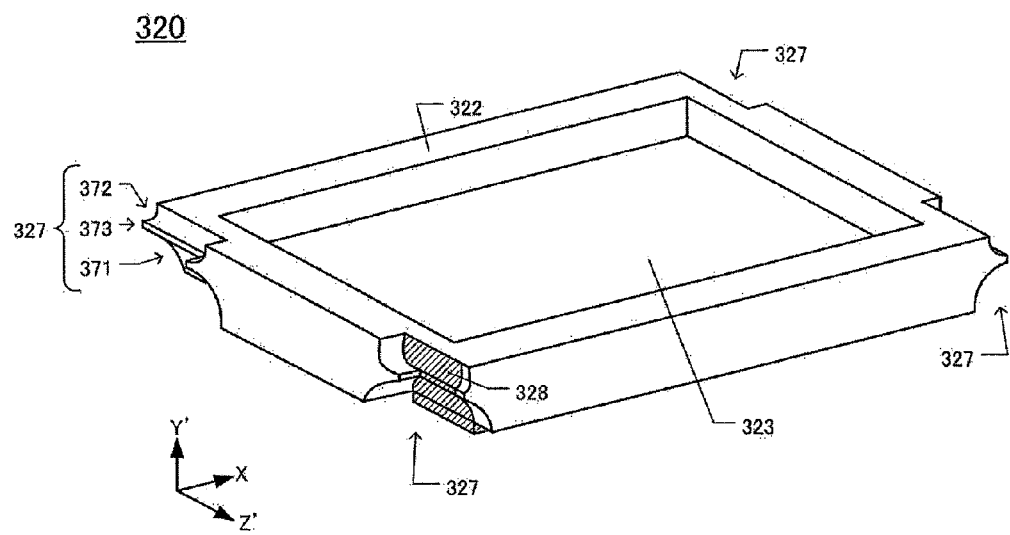
FIG. 18A is a perspective view of a base plate 320.

FIG. 18A is a perspective view of the base plate 320. The base plate 320 is formed in a rectangular shape that has long sides extending in the X axis direction and short sides extending in the Z' axis direction. The base plate 320 has a surface at the −Y' axis side that is a mounting surface on which external electrodes 325 (see FIG. 18B) and grounding terminals 326 (see FIG. 18B) are to be formed. The bonding material 140 is applied over a bonding surface 322 at the +Y' axis side of the base plate 320. The base plate 320 is then bonded to the piezoelectric vibrating piece 130a. Further, a recess 323 is formed to be hollowed into the bonding surface 322 in the −Y' axis direction in the base plate 320. On side faces of corner portions at four corners of the base plate 320, castellations 327 are recessed inwardly into the base plate 320. The castellations 327 extend from the respective corner portions of the base plate 320 in the short side direction. The castellation 327 includes a first surface 371, a second surface 372, and a protruding surface 373. The first surface 371 extends outward from the mounting surface toward the bonding surface 322 side. The second surface 372 extends outward from the bonding surface 322 to the mounting surface. The second surface 372 has a smaller area than that of the first surfaces 371. The protruding surface 373 is disposed between the first surfaces 371 and the second surfaces 372. The protruding surface 373 protrudes outside of the base plate 320 farther than the first surfaces 371 and the second surfaces 372. In the case where the base plate 320 constitutes a part of the piezoelectric device, a wiring electrode 328 is formed on each of the castellations 327 of the base plate 320. The wiring electrodes 328 are electrically connected to the external electrodes 325 and the extraction electrodes 132 of the piezoelectric vibrating piece 130a.

Figure 18B:
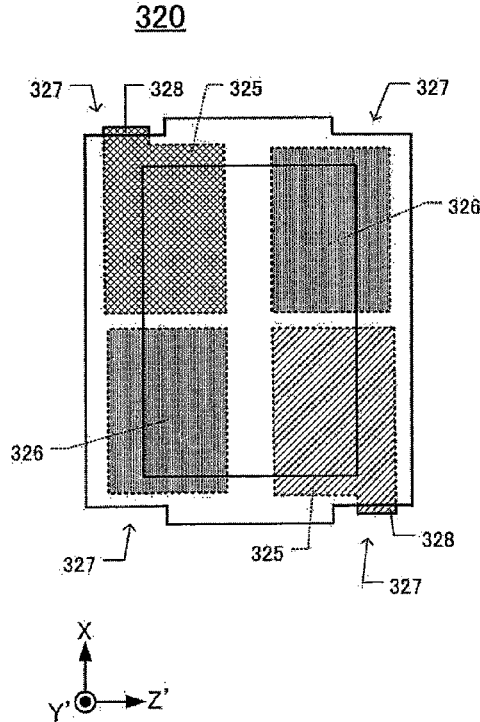
FIG. 18B is a plan view of the base plate 320 illustrating external electrodes 325 and grounding terminals 326.

FIG. 18B is a plan view of the base plate 320 illustrating the external electrodes 325 and the grounding terminals 326. FIG. 18B is a transparent view of the base plate 320 from the +Y' axis side of the base plate 320, illustrating the external electrodes 325 and the grounding terminals 326, which are formed on the surface at the −Y' axis side of the base plate 320. The external electrodes 325 are formed to contact the castellations 327. The grounding terminals 326 are formed not to contact the castellations 327. The external electrode 325 is electrically connected to the wiring electrode 328.

Figure 18C:
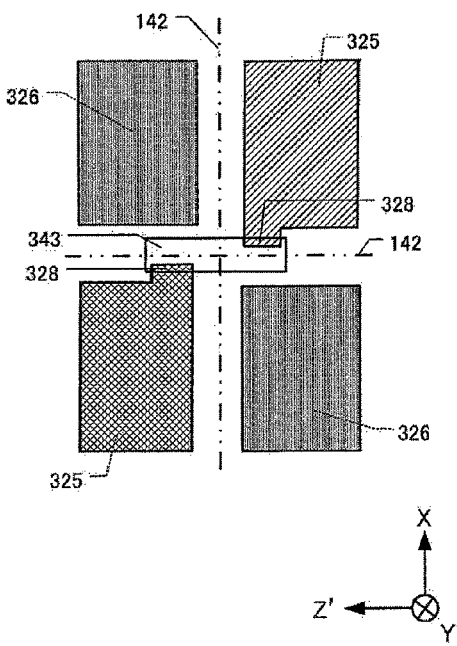
FIG. 18C is a partial plan view of a surface at the −Y' axis side of the base wafer, which is to form the base plate 320.

FIG. 18C is a partial plan view of the surface at the −Y' axis side of the base wafer where the base plates 320 are formed. FIG. 18C is a diagram illustrating a region similar to that of FIG. 17B. FIG. 18C and FIG. 17B are different in shape of the through-holes. FIG. 18C illustrates a through-hole 343 that is formed at an intersection point of the scribe lines 142. The through-hole 343 has a rectangular shape that extends in the Z' axis direction. The through-hole 343 extends in the Z' axis direction. This separates a pair of wiring electrodes 328, which are formed on one through-hole 343, from one another. Accordingly, this prevents the pair of wiring electrodes 328 from being electrically connected to one another.
Configuration of the Base Plate 420

Figure 19A:
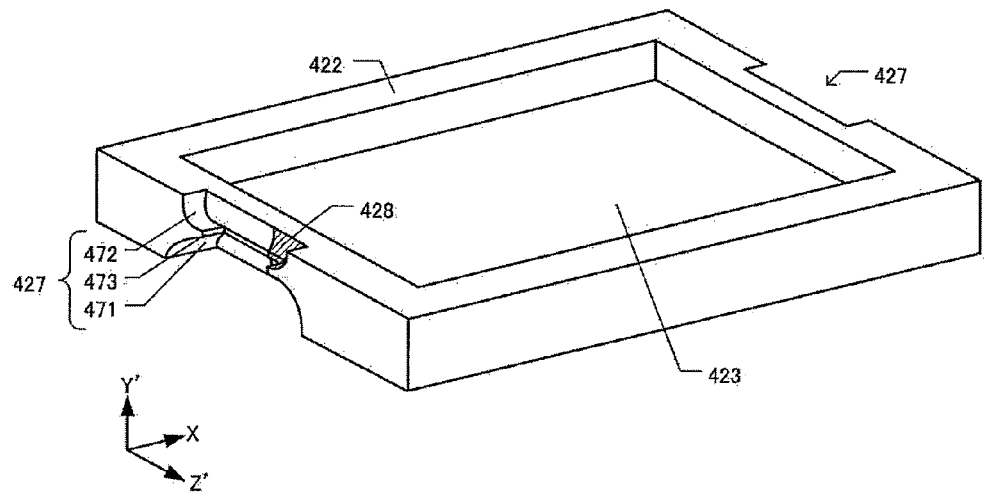
FIG. 19A is a perspective view of a base plate 420.

FIG. 19A is a perspective view of the base plate 420. The base plate 420 is formed in a rectangular shape that has long sides extending in the X axis direction and short sides extending in the Z' axis direction. The base plate 420 has a mounting surface at the −Y' axis side on which external electrodes 425 (see FIG. 19B) and grounding terminals 426 (see FIG. 19B) are formed. The bonding material 140 is applied over a bonding surface 422 at the +Y' axis side of the base plate 420. The base plate 420 is then bonded to the piezoelectric vibrating piece 130a. Further, a recess 423 is formed to be hollowed into the bonding surface 422 in the −Y' axis direction in the base plate 420. On side faces of the short sides that do not include corner portions at four corners of the base plate 420, castellations 427 are recessed inwardly into the base plate 420. The castellation 427 includes a first surface 471, a second surface 472, and a protruding surface 473. The first surface 471 extends outward from the mounting surface toward the bonding surface 422 side. The second surface 472 extends outward from the bonding surface 422 toward the mounting surface. The second surface 472 has a smaller area than that of the first surface 471. The protruding surface 473 is disposed between the first surfaces 471 and the second surfaces 472. The protruding surface 473 protrudes outside of the base plate 420 farther than the first surfaces 471 and the second surfaces 472. In the case where the base plate 420 constitutes a part of the piezoelectric device, a wiring electrode 428 is formed on each of the castellations 427 of the base plate 420. The wiring electrode 428 is electrically connected to the external electrodes 425 and the extraction electrodes 132 of the piezoelectric vibrating piece 130a.

Figure 19B:
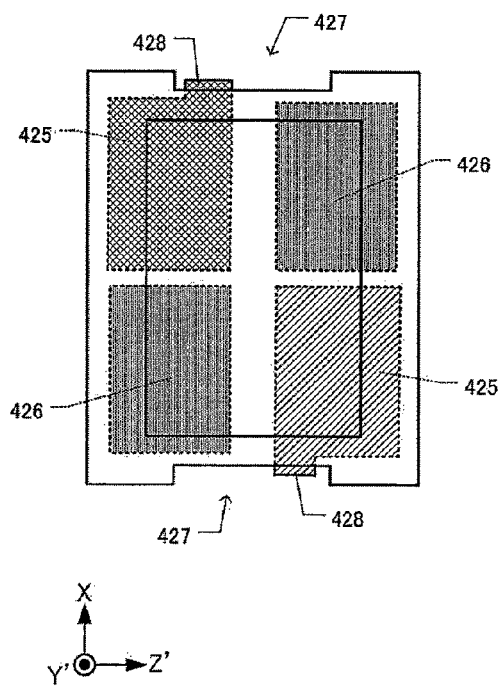
FIG. 19B is a plan view of the base plate 420 illustrating external electrodes 425 and grounding terminals 426.

FIG. 19B is a plan view of the base plate 420 illustrating the external electrodes 425 and the grounding terminals 426. FIG. 19B is a transparent view of the base plate 420 from the +Y' axis side of the base plate 420, illustrating the external electrodes 425 and the grounding terminals 426, which are formed on the surface at the −Y' axis side of the base plate 420. The external electrode 425 is formed to contact the castellation 427. The grounding terminal 426 is formed not to contact the castellation 427. The external electrode 425 and the grounding terminal 426 are not in contact with the short sides or the long sides of the base plate 420. The external electrode 425 is electrically connected to the wiring electrode 428.

Figure 19C:
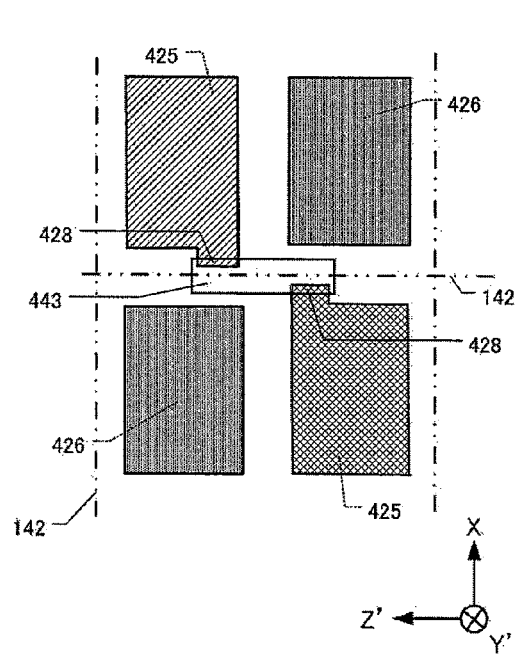
FIG. 19C is a partial plan view of a surface at the −Y' axis side of the base wafer, which is to form the base plate 420.

FIG. 19C is a partial plan view of the surface at the −Y' axis side of the base wafer where the base plates 420 are formed. FIG. 19C illustrates a half of the base plate 420 at the −X axis side and a half of the other base plate 420 at the +X axis side. These two base plates 420 are in contact with one another on the base wafer. The scribe line 142 that extends in the Z' axis direction is illustrated between the two base plates 420. FIG. 19C illustrates the through-holes 443 that has a rectangular shape and extends in the Z' axis direction. The through-hole 443 is formed on the scribe line 142 that extends in the Z' axis direction. The through-hole 443 is not formed on the scribe line 142 that extends in the X axis direction. The through-hole 443 extends in the Z' axis direction. This separates a pair of wiring electrodes 428, which are formed on one through-hole 443, from one another. Accordingly, this prevents the pair of wiring electrodes 428 from being electrically connected to one another.

Representative embodiments have been described in detail above. As evident to those skilled in the art, the present invention may be changed or modified in various ways within the technical scope of the invention.

For example, in the manufacturing process of the piezoelectric device 100 in FIG. 3, step S106 of forming electrodes may be performed before step S105. In this case, while contacting probes on the external electrodes to measure a frequency of the piezoelectric vibrating piece, a metal may be added onto or removed from the excitation electrodes 131 on the surface at the +Y' axis side of the piezoelectric vibrating piece. This ensures a facilitated frequency adjustment of the piezoelectric vibrating piece. The base plate that is made of glass as the base material in the second embodiment may be formed using the method in FIGS. 6A to 6D and 7A to 7D. This method may form castellations without the protruding surface by forming the first surface and the second surface alone.

Further, while in the embodiments, the piezoelectric vibrating pieces are AT-cut quartz-crystal vibrating pieces, for example, a BT-cut or tuning-fork type quartz-crystal vibrating piece that vibrates in a thickness-shear vibration mode may also be used, similarly to the AT-cut quartz-crystal vibrating pieces. Further, the piezoelectric vibrating pieces are basically applied to piezoelectric material including not only quartz-crystal material but also lithium tantalite, lithium niobate, and piezoelectric ceramic.

What is claimed is:

1. A piezoelectric device comprising:
a piezoelectric vibrating piece, including a pair of excitation electrodes and a pair of extraction electrodes, the pair of extraction electrodes being extracted from the pair of excitation electrode;
a base plate, including a bonding surface with a pair of external electrodes and a mounting surface, the piezoelectric vibrating piece being disposed on the mounting surface, a pair of castellations being hollowed into a side face from the mounting surface to the bonding surface, the base plate including one of glass and piezoelectric material;
a non-conductive bonding material, disposed between the piezoelectric vibrating piece and the base plate, the non-conductive bonding material bonding the piezoelectric vibrating piece and the base plate together, wherein,
the pair of castellations include:
a first surface, extending outward from the mounting surface toward the bonding surface side; and
a second surface, extending outward from the bonding surface toward the mounting surface side, the second surface having a smaller area than an area of the first surface, and
a wiring electrode, disposed on the first surface, the second surface, and a side face of the bonding material, the wiring electrode being of a same electrode layer as the external electrode, the wiring electrode extending from the external electrode to the extraction electrodes.

2. The piezoelectric device of claim 1, wherein,
the pair of castellations include a protruding surface between the first surface and the second surface,
the protruding surface protruding outside of the base plate farther than the first surface and the second surface.

3. The piezoelectric device of claim 2, wherein,
the wiring electrode is disposed on a center region of the castellation, and
one of the glass and the piezoelectric material is exposed at an end portion of the castellation where the castellation contacts the side face of the base plate.

4. The piezoelectric device of claim 3, wherein,
the base plate has a rectangular shape with long sides and short sides,
the castellation include at least one of a first shape and a second shape,
the first shape extending in the short side direction within the short side,
the second shape extending from a corner portion in the short side direction,
the corner portions at which the short side and the long side intersecting with one another.

5. The piezoelectric device of claim 2, wherein,
the base plate has a rectangular shape with long sides and short sides,
the castellation include at least one of a first shape and a second shape,
the first shape extending in the short side direction within the short side,
the second shape extending from a corner portion in the short side direction,
the corner portions at which the short side and the long side intersecting with one another.

6. The piezoelectric device of claim 1, wherein,
the wiring electrode is disposed on a center region of the castellation, and one of the glass and the piezoelectric material is exposed at an end portion of the castellation where the castellation contacts the side face of the base plate.

7. The piezoelectric device of claim 6, wherein, the base plate has a rectangular shape with long sides and short sides, the castellation include at least one of a first shape and a second shape, the first shape extending in the short side direction within the short side, the second shape extending from a corner portion in the short side direction, the corner portions at which the short side and the long side intersecting with one another.

8. The piezoelectric device of claim 1, wherein, the base plate has a rectangular shape with long sides and short sides, the castellation include at least one of a first shape and a second shape, the first shape extending in the short side direction within the short side, the second shape extending from a corner portion in the short side direction, the corner portions at which the short side and the long side intersecting with one another.

\* \* \* \* \*